United States Patent
Miura et al.

(10) Patent No.: US 10,202,687 B2
(45) Date of Patent: Feb. 12, 2019

(54) SUBSTRATE PROCESSING METHOD AND SUBSTRATE PROCESSING APPARATUS

(71) Applicant: TOKYO ELECTRON LIMITED, Tokyo (JP)

(72) Inventors: Shigehiro Miura, Oshu (JP); Jun Sato, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 69 days.

(21) Appl. No.: 15/193,776

(22) Filed: Jun. 27, 2016

(65) Prior Publication Data

US 2017/0002464 A1 Jan. 5, 2017

(30) Foreign Application Priority Data

Jun. 30, 2015 (JP) .................................. 2015-130757
Nov. 25, 2015 (JP) .................................. 2015-229391

(51) Int. Cl.
*C23C 16/00* (2006.01)
*C23C 16/34* (2006.01)
*C23C 16/44* (2006.01)
*C23C 16/455* (2006.01)

(52) U.S. Cl.
CPC ........ *C23C 16/345* (2013.01); *C23C 16/4412* (2013.01); *C23C 16/45551* (2013.01)

(58) Field of Classification Search
CPC .............. C23C 16/345; C23C 16/4412; C23C 16/45551
See application file for complete search history.

(56) References Cited

U.S. PATENT DOCUMENTS

| | | | | |
|---|---|---|---|---|
| 6,634,314 | B2 * | 10/2003 | Hwang | C23C 16/45525 118/715 |
| 6,869,641 | B2 * | 3/2005 | Schmitt | C23C 16/4412 427/248.1 |
| 7,828,900 | B2 * | 11/2010 | Hatanaka | C23C 16/0236 118/719 |

FOREIGN PATENT DOCUMENTS

| | | |
|---|---|---|
| CN | 102134710 A | 7/2011 |
| JP | 2008-222728 A | 9/2008 |
| JP | 2010-080924 A | 4/2010 |
| JP | 2011-103495 A | 5/2011 |
| KR | 10-2010-0027036 A | 3/2010 |
| KR | 10-2013-0075690 A | 7/2013 |
| TW | 504738 B | 10/2002 |

\* cited by examiner

*Primary Examiner* — Kelly M Gambetta
(74) *Attorney, Agent, or Firm* — Nath, Goldberg & Meyer; Jerald L. Meyer

(57) ABSTRACT

There is provided a substrate processing method using a processing chamber that is provided with a first process gas supply region, a first exhaust port through which a first process gas supplied to the first process gas supply region is exhausted, a second process gas supply region, a second exhaust port through which a second process gas supplied to the second process gas supply region is exhausted, and a communication space through which the first exhaust port and the second exhaust port communicate with each other, wherein an exhaust pressure in the first exhaust port is set higher than an exhaust pressure in the second exhaust port by a predetermined pressure so as to perform a substrate process while preventing infiltration of the second process gas into the first exhaust port.

18 Claims, 26 Drawing Sheets

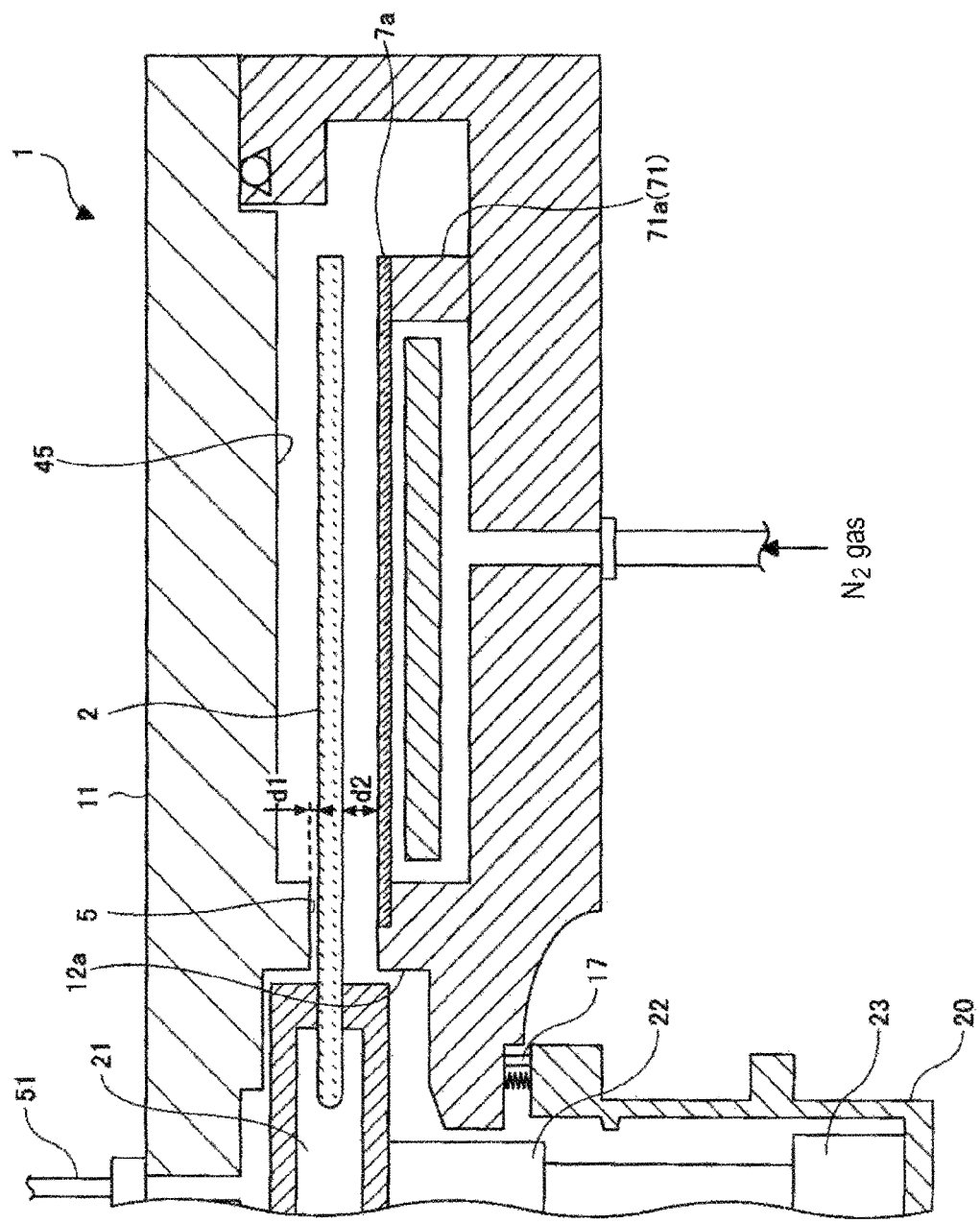

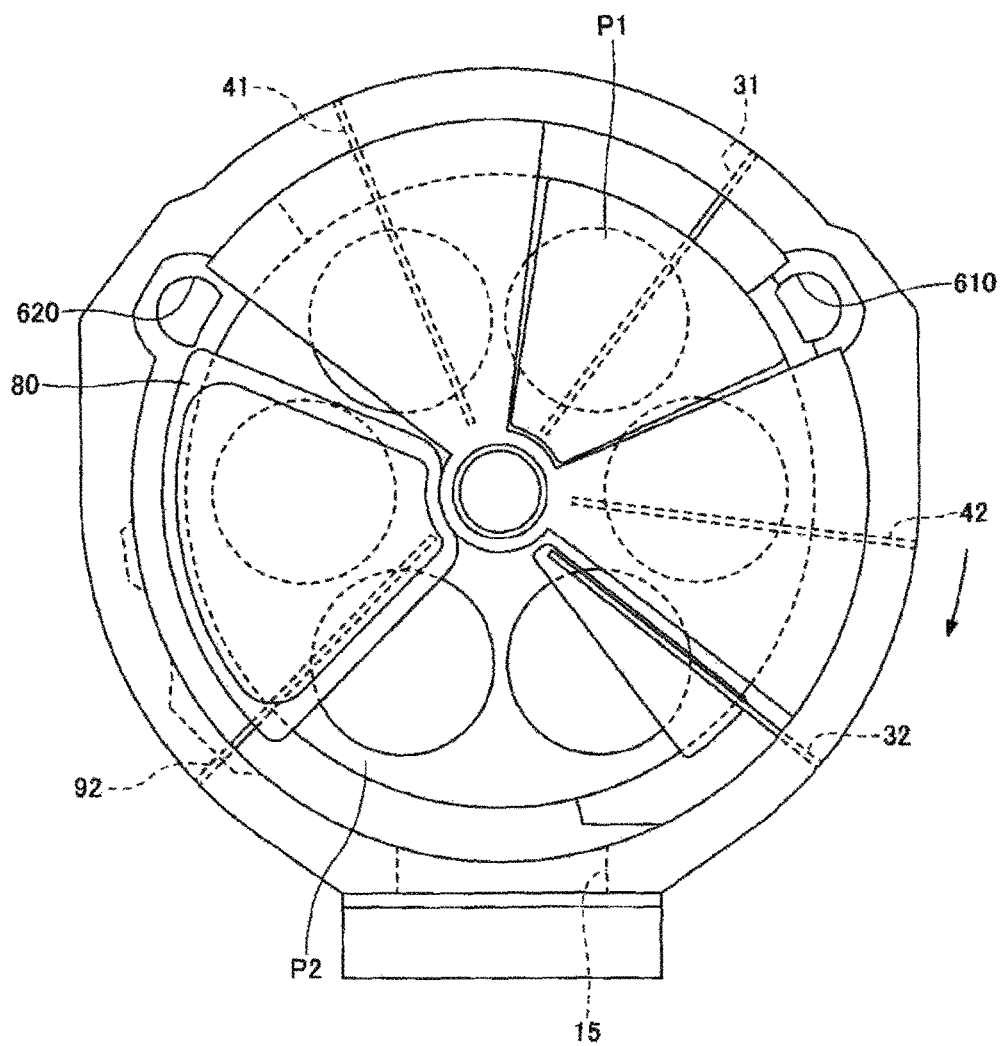

SUBSTRATE PROCESSING METHOD AND SUBSTRATE PROCESSING APPARATUS

CROSS-REFERENCE TO RELATED APPLICATIONS

This application claims the benefit of Japanese Patent Application No. 2015-130757, filed on Jun. 30, 2015 and Japanese Patent Application No. 2015-229391, filed on Nov. 25, 2015, in the Japan Patent Office, the disclosures of which are incorporated herein in their entirety by reference.

TECHNICAL FIELD

The present disclosure relates to a substrate processing method and a substrate processing apparatus.

BACKGROUND

In the related art, a film forming method is known in which a thin film is formed by sequentially supplying at least two kinds of mutually-reacting reaction gases to a surface of a substrate and laminating a plurality of reaction product layers through the execution of this supply cycle. The film forming method includes a step of mounting a substrate on a rotary table installed inside a vacuum container and rotating the rotary table, a step of supplying a first reaction gas and a second reaction gas to a surface of a region (on which the substrate is mounted) of the rotary table from a first reaction gas supply means and a second reaction gas supply means which are installed in the vacuum container in a spaced-apart relationship along a rotational direction, and a step of supplying a separation gas from a separation gas supply means installed in a separation region defined between the first reaction gas supply means and the second reaction gas supply means in the rotational direction and diffusing the separation gas toward a narrow space defined between a ceiling surface of the vacuum container and the rotary table at the opposite sides of the separation gas supply means in the rotational direction.

In such a film forming method, the reaction gas and the separation gas diffusing toward the opposite sides of the separation region are exhausted from an exhaust port of a first exhaust path opened between a first processing region and the separation region adjoining the first processing region at the downstream side in the rotational direction when viewed from the rotation center of the rotary table and an exhaust port of a second exhaust path opened between a second processing region and a separation region adjoining the second processing region at the downstream side in the rotational direction when viewed from the rotation center of the rotary table. The film forming method includes a step of mutually independently exhausting the gases from the first processing region and the second processing region and a step of mutually independently exhausting the interior of the first exhaust path and the interior of the second exhaust path with a first vacuum exhaust means and a second vacuum exhaust means. The first reaction gas and the second reaction gas are independently exhausted from the first processing region and the second processing region. Since a clearance space existing under the rotary table is configured to have an extremely narrow size, the first reaction gas supplied to the first processing region and the second reaction gas supplied to the second processing region are mutually independently exhausted from a first exhaust port and a second exhaust port without passing through the underside of the rotary table.

However, as the process is diversified in recent years, it is often required that the process is performed in a state where a clearance is formed in the underside of a rotary table. Specifically, in a high-temperature process, when a wafer is loaded into a vacuum container and mounted on a rotary table, the wafer may be largely warped. A process cannot be started until the warp is settled. In order to rapidly start the process even a little bit, the rotary table is often configured to move up and down. When mounting a wafer, the rotary table is moved down to enlarge a space. If a warped portion is settled, the rotary table is moved up to perform the process.

In such a process, since the process is performed in a state in which the rotary table is moved up, a clearance is generated under the rotary table. The first reaction gas and the second reaction gas are mixed with each other in the clearance. This may make it impossible to independently exhaust the first reaction gas and the second reaction gas. The first reaction gas and the second reaction gas may react with each other to generate a reaction product. Therefore, if the first reaction gas and the second reaction gas react with each other in the vicinity of the first exhaust port or the second exhaust port, an unnecessary reaction product may be generated in the first exhaust port or the second exhaust port. Thus, the interior of the vacuum container may be contaminated.

SUMMARY

Some embodiments of the present disclosure provide a substrate processing method and a substrate processing apparatus which are capable of performing independent exhaust in first and second exhaust ports even in a process in which a clearance is generated under a rotary table.

According to one embodiment of the present disclosure, there is provided a substrate processing method using a processing chamber that is provided with a first process gas supply region, a first exhaust port through which a first process gas supplied to the first process gas supply region is exhausted, a second process gas supply region, a second exhaust port through which a second process gas supplied to the second process gas supply region is exhausted, and a communication space through which the first exhaust port and the second exhaust port communicate with each other, wherein an exhaust pressure in the first exhaust port is set higher than an exhaust pressure in the second exhaust port by a predetermined pressure so as to perform a substrate process while preventing infiltration of the second process gas into the first exhaust port.

According to another embodiment of the present disclosure, there is provided a substrate processing apparatus, including: a processing chamber; a rotary table provided within the processing chamber, configured to mount a substrate on a surface thereof and configured to move up and down; first and second process gas supply regions defined above the rotary table in a mutually spaced-apart relationship along a circumferential direction of the rotary table; first and second exhaust ports formed under the rotary table in a corresponding relationship with the first and second process gas supply regions; first and second pressure regulation valves configured to regulate exhaust pressures in the first and second exhaust ports; a separation region configured to protrude downward from a ceiling surface of the processing chamber and defined between the first process gas supply region and the second process gas supply region so as to separate the first process gas supply region and the second process gas supply region from each other above the rotary table; and a control part configured to execute control so that the rotary table is moved down when mounting the substrate on the rotary table and the rotary table is moved up when rotating the rotary table to perform a substrate process, the control part configured to control the first and second pressure regulation valves so that the exhaust pressure in the first exhaust port becomes higher than the exhaust pressure in the second exhaust port by a predetermined pressure in order to prevent the second process gas from being exhausted from the first exhaust port via a communication space generated by the upward movement of the rotary table and through which the first exhaust port and the second exhaust port communicate with each other.

According to yet another embodiment of the present disclosure, there is provided a substrate processing method using a processing chamber that is provide with: a rotary table configured to mount a substrate on an upper surface thereof; and a processing chamber including a first raw material gas supply region defined above the rotary table in a mutually spaced-apart relationship along a rotational direction of the rotary table and through which a raw material gas is supplied to the substrate, a first reaction gas supply region to which a reaction gas capable of reacting with the raw material gas to generate a reaction product is supplied, a second raw material gas supply region to which the raw material gas is supplied, a second reaction gas supply region to which the reaction gas is supplied, a first exhaust port through which the raw material gas supplied to the first raw material gas supply region is exhausted, a second exhaust port through which the reaction gas supplied to the first reaction gas supply region is exhausted, a third exhaust port through which the raw material gas supplied to the second raw material gas supply region is exhausted, a fourth exhaust port through which the reaction gas supplied to the second reaction gas supply region is exhausted, and a communication space through which the first to fourth exhaust ports communicate with one another, wherein an exhaust pressure in the first exhaust port is set higher than exhaust pressures in the second to fourth exhaust ports by a predetermined pressure so as to perform a substrate process while preventing infiltration of the reaction gas into the first exhaust port.

According to still another embodiment of the present disclosure, there is provided a substrate processing apparatus, including: a processing chamber; a rotary table provided within the processing chamber, configured to mount a substrate on a surface thereof and configured to move up and down; a first raw material gas supply region defined above the rotary table in a mutually spaced-apart relationship along a rotational direction of the rotary table and through which a raw material gas is supplied to the rotary table; a first reaction gas supply region to which a reaction gas capable of reacting with the raw material gas to generate a reaction product is supplied; a second raw material gas supply region to which the raw material gas is supplied; a second reaction gas supply region configured to supply the reaction gas; first to fourth exhaust ports formed under the rotary table in a corresponding relationship with the first raw material gas supply region, the first reaction gas supply region, the second raw material gas supply region and the second reaction gas supply region; first to fourth pressure regulation valves configured to regulate exhaust pressures in the first to fourth exhaust ports; separation regions formed to protrude downward from a ceiling surface of the processing chamber and defined between the first raw material gas supply region, the first reaction gas supply region, the second raw material gas supply region and the second reaction gas supply region so as to separate the first raw material gas supply region, the first reaction gas supply region, the second raw material gas supply region and the second reaction gas supply region from each other above the rotary table; and a control part configured to execute control so that the rotary table is moved down when mounting the substrate on the rotary table and the rotary table is moved up when rotating the rotary table to perform a substrate process, the control part configured to control the first to fourth pressure regulation valves so that the exhaust pressure in the first exhaust port becomes higher than the exhaust pressures in the second to fourth exhaust ports by a predetermined pressure in order to prevent the reaction gas from being exhausted from the first exhaust port via a communication space generated by the upward movement of the rotary table and through which the first to fourth exhaust ports communicate with one another.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7 is a view illustrating one example of a state in which the rotary table is moved up.

FIG. 8 is a view for explaining basic process conditions including an arrangement state of a container body in simulation results illustrated in FIGS. 9A to 9D and subsequent figures.

DETAILED DESCRIPTION

A mode for carrying out the present disclosure will now be described with reference to the drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
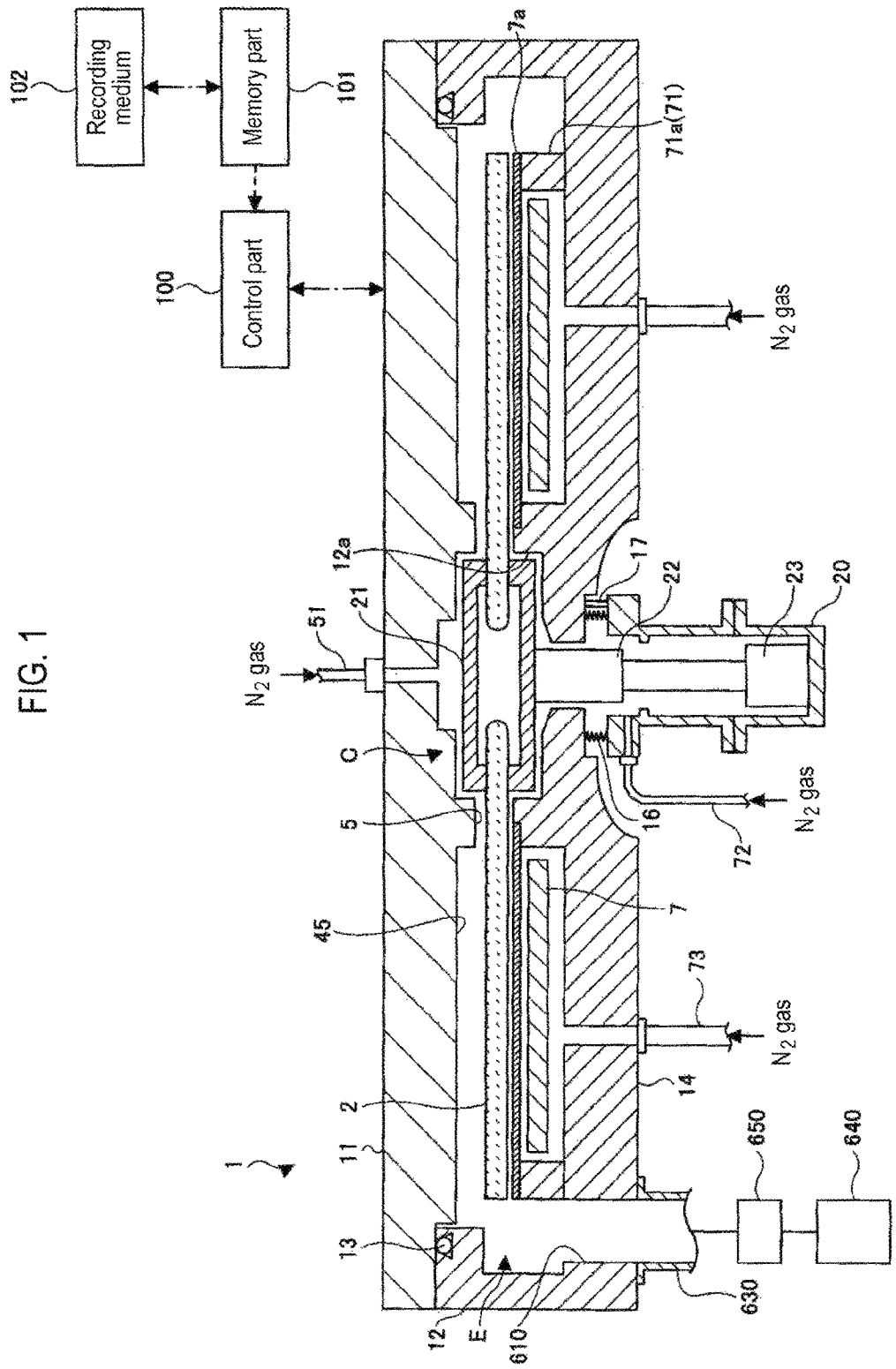
FIG. 1 is a schematic sectional view illustrating a substrate processing apparatus according to a first embodiment of the present disclosure.
Figure 2:
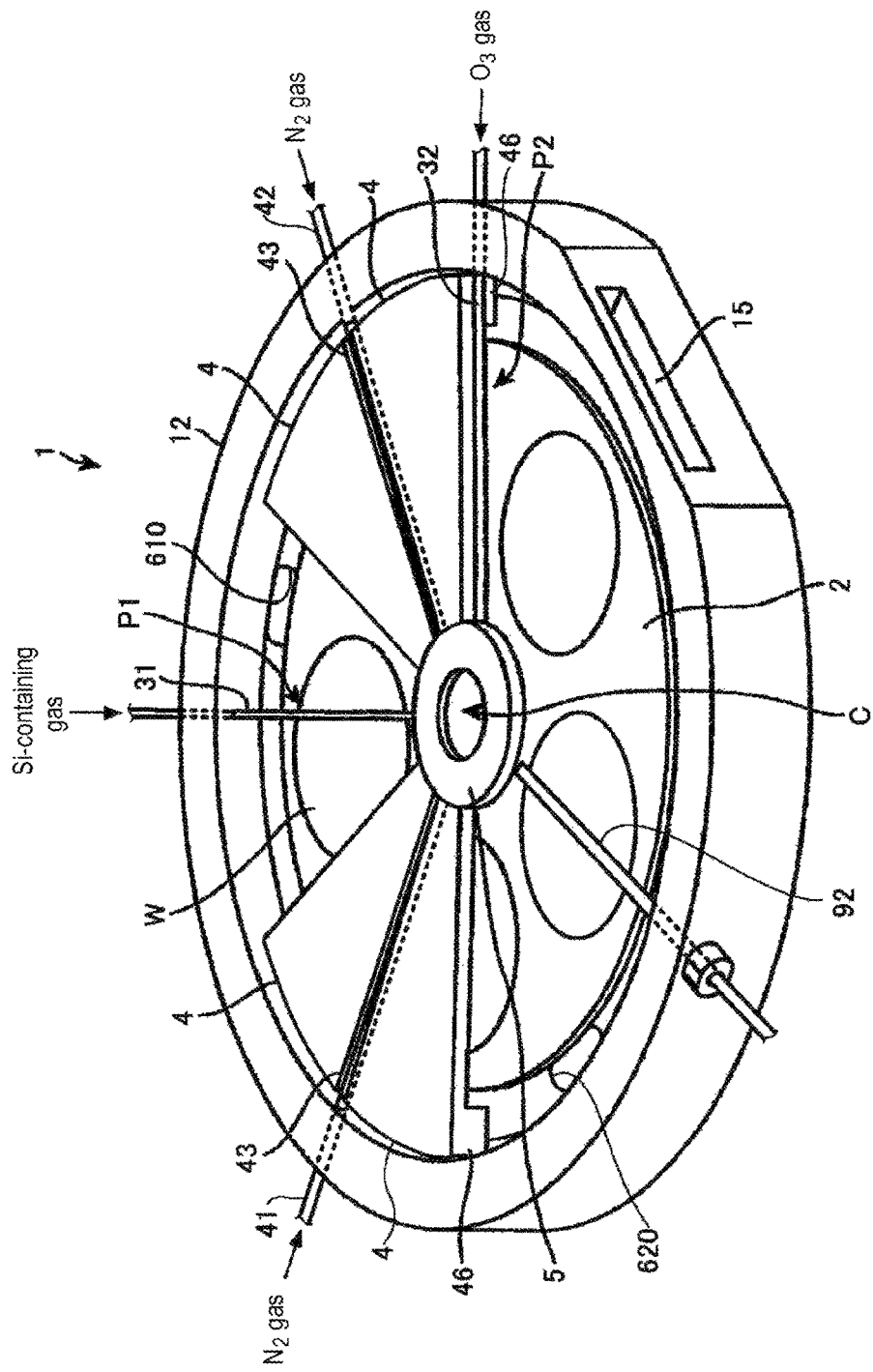
FIG. 2 is a schematic perspective view illustrating an internal configuration of a vacuum container of the substrate processing apparatus illustrated in FIG. 1.
Figure 3:
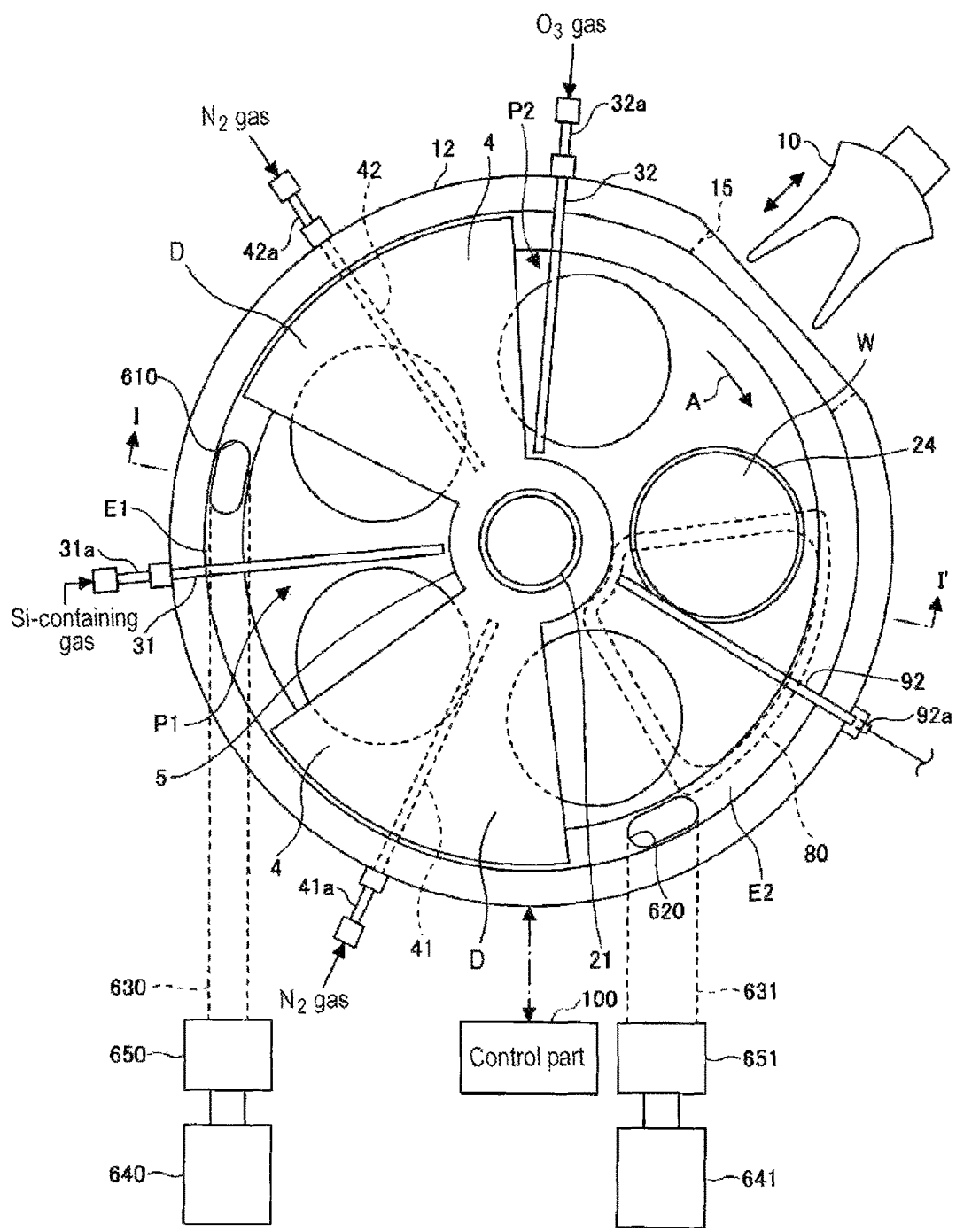
FIG. 3 is a schematic plane view illustrating the internal configuration of the vacuum container of the substrate processing apparatus illustrated in FIG. 1.

Referring to FIGS. 1 to 3, a substrate processing apparatus according to a first embodiment of the present disclosure includes a flat vacuum container 1 having a substantially-circular planar shape, and a rotary table 2 installed within the vacuum container 1 and having a rotation center at the center of the vacuum container 1. The vacuum container 1 is a processing chamber for performing a substrate process on wafers W accommodated therein. The vacuum container 1 includes a cylindrical container body 12 with a bottom, and a ceiling plate 11 air-tightly and detachably installed on an upper surface of the container body 12 through a seal member 13 (see FIG. 1) such as, e.g., an O-ring or the like.

The rotary table 2 is fixed to a cylindrical core portion 21 at the center thereof. The core portion 21 is fixed to an upper end of a vertically-extending rotary shaft 22. The rotary shaft 22 penetrates through a bottom portion 14 of the vacuum container 1. A lower end of the rotary shaft 22 is installed in a drive part 23 configured to rotate the rotary shaft 22 (see FIG. 1) about a vertical axis. The rotary shaft 22 and the drive part 23 are received within a tubular case body 20 having an opened top portion. A flange portion provided in the top portion of the case body 20 is air-tightly attached to a lower surface of the bottom portion 14 of the vacuum container 1, whereby internal and external atmospheres of the case body 20 are kept in an air-tight state.

As illustrated in FIGS. 2 and 3, circular recess portions 24 on which a plurality of (five, in the illustrated example) semiconductor wafers (hereinafter referred to as "wafers") W used as substrates is mounted, are formed in a front surface of the rotary table 2 along a rotational direction (circumferential direction). In FIG. 3, for the sake of convenience, the wafer W is shown to be mounted on only one of the recess portions 24. Each of the recess portions 24 has an inner diameter (e.g., 4 mm) slightly larger than the diameter of the wafer W and a depth which is substantially equal to a thickness of the wafer W. Accordingly, if the wafer W is received within the respective recess portion 24, the surface of the wafer W and the surface of the rotary table 2 (i.e., a region on which the wafer W is not mounted) are flush with each other. In a bottom surface of each of the recess portions 24, through-holes (not shown) are formed into which, for example, three lift pins (not shown) for supporting a rear surface of the wafer W to move the wafer W up and down, are inserted.

FIGS. 2 and 3 are views for explaining an internal structure of the vacuum container 1. For the sake of convenience in description, the ceiling plate 11 is not shown in FIGS. 2 and 3. As illustrated in FIGS. 2 and 3, at an upper side of the rotary table 2, a process gas nozzle 31, a process gas nozzle 32, separation gas nozzles 41 and 42, and a plasma gas nozzle 92, which are respectively made of, for example, quartz, are disposed in a spaced-apart relationship in the circumferential direction of the vacuum container 1 (in the rotational direction of the rotary table 2 (indicated by arrow A in FIG. 3)). In the illustrated example, the plasma gas nozzle 92, the separation gas nozzle 41, the process gas nozzle 31, the separation gas nozzle 42 and the process gas nozzle 32 are arranged in the named order in the clockwise direction (the rotational direction of the rotary table 2) from a transfer port 15 (to be described later). These nozzles 92, 31, 32, 41 and 42 are installed to extend from the outer peripheral wall of the vacuum container 1 into the vacuum container 1 and to horizontally extend with respect to the rotary table 2 along a radial direction of the container body 12. Gas introduction ports 92a, 31a, 32a, 41a and 42a (see FIG. 3), which are base end portions of the respective nozzles 92, 31, 32, 41 and 42, are fixed to the outer peripheral wall of the container body 12.

As indicated in a simplified manner by a broken line in FIG. 3, a plasma generator 80 is installed above the process gas nozzle 92. The plasma generator 80 may be installed as needed and is not essential. Thus, in this embodiment, the plasma generator 80 is shown in a simplified manner.

The process gas nozzle 31 is coupled to a supply source (not shown) of a Si (silicon)-containing gas as a first process gas via a pipeline, a flow rate controller and the like (all not shown). The process gas nozzle 32 is coupled to a supply source (not shown) of an oxidizing gas as a second process gas via a pipeline, a flow rate controller and the like (all not shown). Both the separation gas nozzles 41 and 42 are coupled to a supply source (not shown) of a nitrogen ($N_2$) gas as a separation gas via a pipeline, a flow rate controller and the like (all not shown).

For example, an organic aminosilane gas such as diisopropylaminosilane or the like may be used as the Si-containing gas, and an $O_3$ (ozone) gas, an $O_2$ (oxygen) gas or a mixed gas thereof may be used as the oxidizing gas.

In each of the process gas nozzles 31 and 32, a plurality of gas injection holes 33 opened toward the rotary table 2 is arranged at intervals of, for example, 10 mm, along the longitudinal direction of the process gas nozzles 31 and 32. A region existing under the process gas nozzle 31 is defined as a first processing region P1 for causing the Si-containing gas to be adsorbed onto the wafer W. A region existing under the process gas nozzle 32 is defined as a second processing region P2 in which the Si-containing gas adsorbed onto the wafer W in the first processing region P1 is oxidized. The first processing region P1 and the second processing region P2 are regions to which the first process gas and the second process gas are respectively supplied. Thus, the first processing region P1 and the second processing region P2 may be referred to as a first process gas supply region P1 and a second process gas supply region P2, respectively.

Referring to FIGS. 2 and 3, two convex portions 4 are installed within the vacuum container 1. The convex portions 4 and the separation gas nozzles 41 and 42 constitute separation regions D. As will be described later, the convex portions 4 are attached to the rear surface of the ceiling plate 11 so as to protrude toward the rotary table 2. Each of the convex portions 4 has a fan-like planar shape with the apex portion thereof cut in an arc shape. In this embodiment, each of the convex portions 4 is disposed such that the inner arc thereof is connected to a protrusion portion 5 (which will be described later) and the outer arc thereof extends along the inner circumferential surface of the container body 12 of the vacuum container 1.

Figure 4:
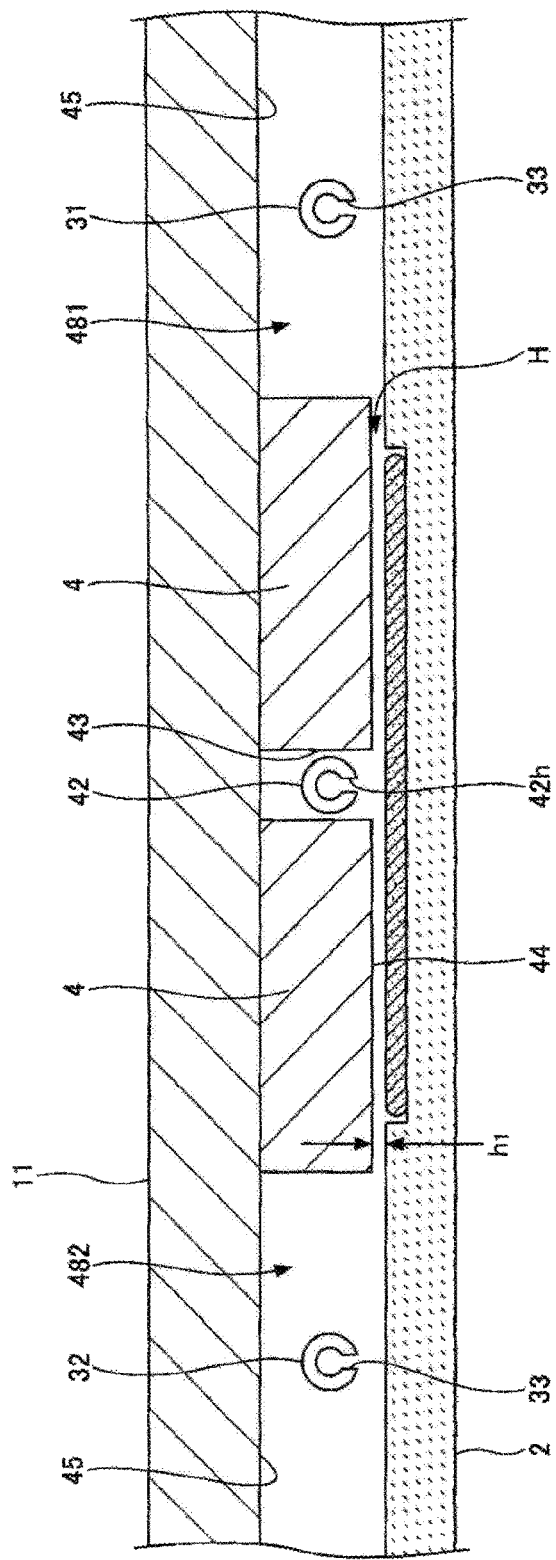
FIG. 4 is a schematic sectional view of the vacuum container, which is taken along a concentric circle of a rotary table rotatably installed within the vacuum container of the substrate processing apparatus illustrated in FIG. 1.

FIG. 4 illustrates a cross section of the vacuum container 1 taken along a concentric circle of the rotary table 2 from the process gas nozzle 31 to the process gas nozzle 32. As illustrated in FIG. 4, each of the convex portions 4 is attached to the rear surface of the ceiling plate 11. Therefore, a flat low ceiling surface 44 (a first ceiling surface) as a lower surface of each of the convex portions 4, and high ceiling surfaces 45 (second ceiling surfaces) higher than the ceiling surface 44, which is positioned at both outer sides of the ceiling surface 44 in the circumferential direction, exist within the vacuum container 1. The ceiling surface 44 has a fan-like planar shape with the apex portion thereof cut in an arc shape. Furthermore, as illustrated in FIG. 4, a groove portion 43 extending in the radial direction is formed at the center of each of the convex portions 4 in the circumferential direction. The separation gas nozzle 42 is accommodated within the groove portion 43. Similarly, a groove portion 43 is formed in the other convex portion 4. The separation gas nozzle 41 is accommodated within the groove portion 43. Furthermore, the process gas nozzles 31 and 32 are respectively installed in spaces 481 and 482 existing under the high ceiling surfaces 45. These process gas nozzles 31 and 32 are installed in the vicinity of the wafers W while being spaced apart from the ceiling surfaces 45.

Furthermore, a plurality of gas injection holes 42h (see FIG. 4) opened toward the rotary table 2 is formed in each of the separation gas nozzles 41 and 42 which are accommodated in the groove portions 43 of the convex portions 4. The gas injection holes 42h are arranged at intervals of, for example, 10 mm along the longitudinal direction of the respective separation gas nozzles 41 and 42.

A separation space H as a narrow space is formed between the ceiling surfaces 44 and the rotary table 2. If a $N_2$ gas is supplied from the gas injection holes 42h of the separation gas nozzle 42, the $N_2$ gas flows toward the spaces 481 and 482 through the separation space H. At this time, a pressure in the separation space H can be made higher than the pressure in the spaces 481 and 482 by the $N_2$ gas, because a volume of the separation space H is smaller than the volumes of the spaces 481 and 482. That is to say, the separation space H having a high pressure is formed between the spaces 481 and 482. Furthermore, the $N_2$ gas flowing out from the separation space H to the spaces 481 and 482 acts as a counter flow against the Si-containing gas coming from the first processing region P1 and the oxidizing gas coming from the second processing region P2. Thus, the Si-containing gas coming from the first processing region P1 and the oxidizing gas coming from the second processing region P2 are separated by the separation space H. This suppresses the Si-containing gas and the oxidizing gas from being mixed and reacting with each other within the vacuum container 1.

In some embodiments, a height hl of the ceiling surface 44 with respect to the upper surface of the rotary table 2 may be set at a height suitable for making the pressure in the separation space H higher than the pressure in the spaces 481 and 482, in view of the internal pressure of the vacuum container 1, the rotation speed of the rotary table 2, the supply amount of the separation gas ($N_2$ gas) and the like applied in a film forming process.

A protrusion portion 5 (see FIGS. 1 to 3) which surrounds the outer periphery of the core portion 21 for fixing the rotary table 2 is formed on the lower surface of the ceiling plate 11. In this embodiment, the protrusion portion 5 is connected to rotational central portions of the convex portions 4. A lower surface of the protrusion portion 5 is formed at the same height as the height of the ceiling surface 44.

Figure 5:
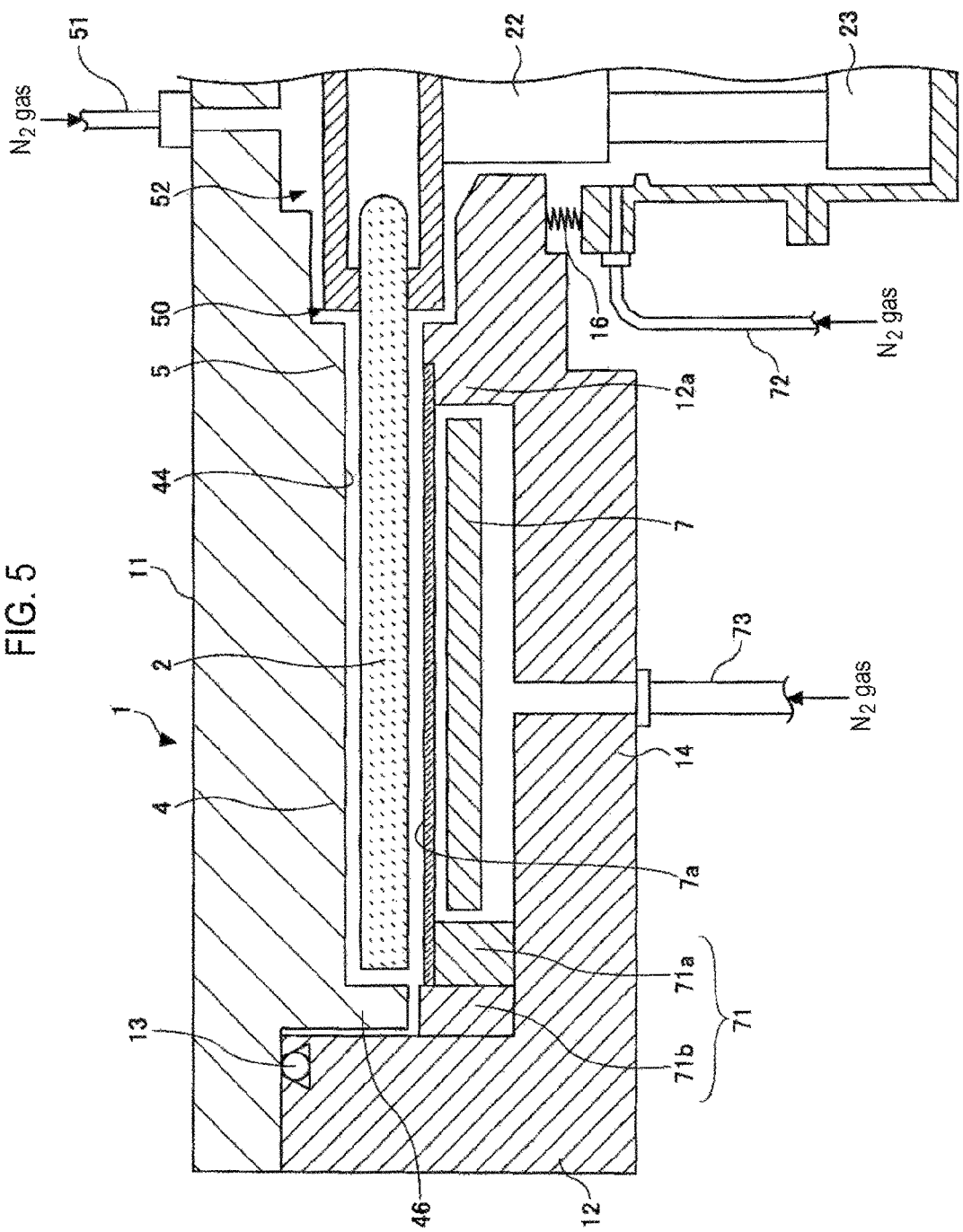
FIG. 5 is another schematic sectional view of the substrate processing apparatus illustrated in FIG. 1.

FIG. 1 referred to above is a sectional view taken along line I-I' in FIG. 3, illustrating the regions in which the ceiling surfaces 45 are provided. On the other hand, FIG. 5 is a sectional view illustrating the region in which the ceiling surface 44 is installed. As illustrated in FIG. 5, a bent portion 46 bent in an L shape so as to face an outer end surface of the rotary table 2 is formed in a peripheral edge portion of each of the fan-like convex portions 4 (in an outer-edge-side portion of the vacuum container 1). Similar to the convex portions 4, the bent portion 46 restrains the process gases from infiltrating from the opposite sides of the separation region D, thereby suppressing mixture of the gases. The fan-like convex portions 4 are provided in the ceiling plate 11. The ceiling plate 11 is detachable from the container body 12. A small gap exists between the outer circumferential surface of the bent portion 46 and the container body 12. A gap between the inner circumferential surface of the bent portion 46 and the outer end surface of the rotary table 2 and a gap between the outer circumferential surface of the bent portion 46 and the container body 12 may be set at, for example, the same dimension as the height of the ceiling surface 44 with respect to the upper surface of the rotary table 2.

In the separation region D, as illustrated in FIG. 4, the inner peripheral wall of the container body 12 is formed into a vertical surface in the vicinity of the outer circumferential surface of the bent portion 46. However, in the regions other than the separation region D, as illustrated in FIG. 1, the inner peripheral wall of the container body 12 is outwardly concave over a range which spans from the portion facing the outer end surface of the rotary table 2 to the bottom portion 14. Hereinafter, for the sake of convenience in description, the concave portion having a substantially rectangular cross-sectional shape will be referred to as an exhaust region. Specifically, the exhaust region communicating with the first processing region P1 will be referred to as a first exhaust region E1. The exhaust region communicating with the second processing region P2 will be referred to as a second exhaust region E2. As illustrated in FIGS. 1 to 3, a first exhaust port 610 and a second exhaust port 620 are respectively formed in bottom portions of the first exhaust region E1 and the second exhaust region E2. As illustrated in FIGS. 1 and 3, the first exhaust port 610 and the second exhaust port 620 are respectively connected to, for example, vacuum pumps 640 and 641, which are vacuum exhaust means, via exhaust pipes 630 and 631. Furthermore, an automatic pressure controller (APC) 650, which is a pressure regulation means, is installed in the exhaust pipe 630 between the first exhaust port 610 and the vacuum pump 640. Similarly, an automatic pressure controller 651, which is a pressure regulation means, is installed in the exhaust pipe 631 between the second exhaust port 620 and the vacuum pump 641. Thus, the exhaust pressures in the first exhaust port 610 and the second exhaust port 620 can be controlled independently of each other.

As illustrated in FIGS. 1 and 5, a heater unit 7 used as heating means is installed in a space between the rotary table 2 and the bottom portion 14 of the vacuum container 1. Thus, the wafers W mounted on the rotary table 2 are heated to a temperature (e.g., 450 degrees C.) determined by a process recipe through the rotary table 2. At the lower side of the vicinity of a peripheral edge of the rotary table 2, there is installed a ring-shaped cover member 71 (see FIG. 5) in order to suppress infiltration of the gases into the region in the downside of the rotary table 2 by partitioning an atmosphere in an area spanning from the space existing above the rotary table 2 to the exhaust regions E1 and E2 and an atmosphere in which the heater unit 7 is mounted. The cover member 71 includes an inner member 71a installed so as to face the outer edge portion of the rotary table 2 and the outer side of the outer edge portion from the lower side, and an outer member 71b installed between the inner member 71a and the inner wall surface of the vacuum container 1. The outer member 71b is installed in close proximity to the bent portion 46 at the lower side of the bent portion 46 formed in the outer edge portion of each of the convex portions 4 in the separation region D. The inner member 71a surrounds the entire periphery of the heater unit 7 at the lower side of the outer edge portion of the rotary table 2 (and at the lower side of the region existing slightly outward of the outer edge portion).

In the region closer to the rotation center than the space in which the heater unit 7 is disposed, the bottom portion 14 protrudes upward so as to approach the core portion 21 in the vicinity of the central region of the lower surface of the rotary table 2, thereby forming a protrusion portion 12a. A narrow space exists between the protrusion portion 12a and the core portion 21. Furthermore, a narrow space exists between the inner circumferential surface of the through-hole of the bottom portion 14, through which the rotary shaft 22 passes, and the rotary shaft 22. These narrow spaces communicate with the case body 20. In the case body 20, a purge gas supply pipe 72 is installed for supplying a N₂ gas as a purge gas into the narrow spaces to purge the narrow spaces. In the bottom portion 14 of the vacuum container 1, a plurality of purge gas supply pipes 73 is installed for purging the arrangement space of the heater unit 7 at specified angular intervals in the circumferential direction under the heater unit 7 (only one of the purge gas supply pipes 73 is shown in FIG. 5). Furthermore, a lid member 7a configured to cover a gap between the inner peripheral wall of the outer member 71b (the upper surface of the inner member 71a) and an upper end portion of the protrusion portion 12a in the circumferential direction is installed between the heater unit 7 and the rotary table 2 in order to suppress infiltration of the gases into the region in which the heater unit 7 is installed. The lid member 7a may be made of, for example, quartz.

A separation gas supply pipe 51 is connected to the central portion of the ceiling plate 11 of the vacuum container 1 and is configured to supply a N₂ gas as a separation gas to a space 52 between the ceiling plate 11 and the core portion 21. The separation gas supplied to the space 52 passes through a narrow gap 50 formed between the protrusion portion 5 and the rotary table 2 and flows toward the peripheral edge of the rotary table 2 along a surface of region (on which the wafer is mounted) of the rotary table 2. A pressure in the space 50 can be kept higher than the pressure in the spaces 481 and 482 by the separation gas. Accordingly, due to the existence of the space 50, the Si-containing gas supplied to the first processing region P1 and the oxidizing gas supplied to the second processing region P2 are kept from passing through a central region C and from being mixed with each other. That is to say, the space 50 (or the central region C) can function just like the separation space H (or the separation region D).

As illustrated in FIG. 3, a transfer port 15 through which the wafer W as a substrate is transferred between an external transfer arm 10 and the rotary table 2, is formed in the sidewall of the vacuum container 1. The transfer port 15 is opened and closed by a gate valve (not shown). The wafer W is transferred between the recess portion 24 as the wafer mounting region of the rotary table 2 and the transfer arm 10 at a position where the recess portion 24 faces the transfer port 15. To do this, lift pins for transfer (not shown) for penetrating the recess portion 24 and lifting the wafer W from the rear surface thereof and a lift mechanism (not shown) for moving the lift pins up and down are installed in a region corresponding to the transfer position at the lower side of the rotary table 2.

As illustrated in FIG. 1, a control part 100 formed of a computer and configured to control an overall operation of the substrate processing apparatus is installed in the substrate processing apparatus according to this embodiment. A program which causes the substrate processing apparatus to carry out the below-described substrate processing method under the control of the control part 100 is stored in a memory of the control part 100. The program includes a step group which is organized so as to perform the below-described substrate processing method. The program is stored in a recording medium 102 such as a hard disk, a compact disk, a magneto-optical disk, a memory card, a flexible disk or the like. The program is read into a memory part 101 by a specified reading device and is installed in the control part 100.

Furthermore, as illustrated in FIG. 1, a bellows 16 is installed between the bottom portion 14 of the container body 12 and the case body 20 around the rotary shaft 22. An elevator mechanism 17 capable of moving the rotary table 2 up and down and changing the height of the rotary table 2 is installed outside the bellows 16. The rotary table 2 is moved up and down by the elevator mechanism 17. The bellows 16 is expanded and contracted in response to the up/down movement of the rotary table 2. It is therefore possible to change the distance between the ceiling surface 45 and the wafer W. By installing the bellows 16 and the elevator mechanism 17 in a portion of the components that constitute the rotary shaft of the rotary table 2, it is possible to change the distance between the ceiling surface 45 and the wafer W while keeping the processed surface of the wafer W in parallel. In some embodiments, the elevator mechanism 17 may be realized in many different configurations as long as the elevator mechanism 17 can move the rotary table 2 up and down. As an example, the elevator mechanism 17 may employ a structure in which the length of the rotary shaft 22 is expanded and contracted by gears or the like.

The reason for installing this elevator mechanism 17 is as follows. When the substrate process is performed while maintaining the interior of the vacuum container 1 at a high temperature of 400 degrees C. or more, even if the heater unit 7 is stopped in order to unload and load the wafer W, the interior of the vacuum container 1 is still kept at a high temperature. When the wafer W is loaded into the vacuum container 1 and is mounted on the rotary table 2, a phenomenon occurs in which the wafer W is largely warped.

Figure 6:
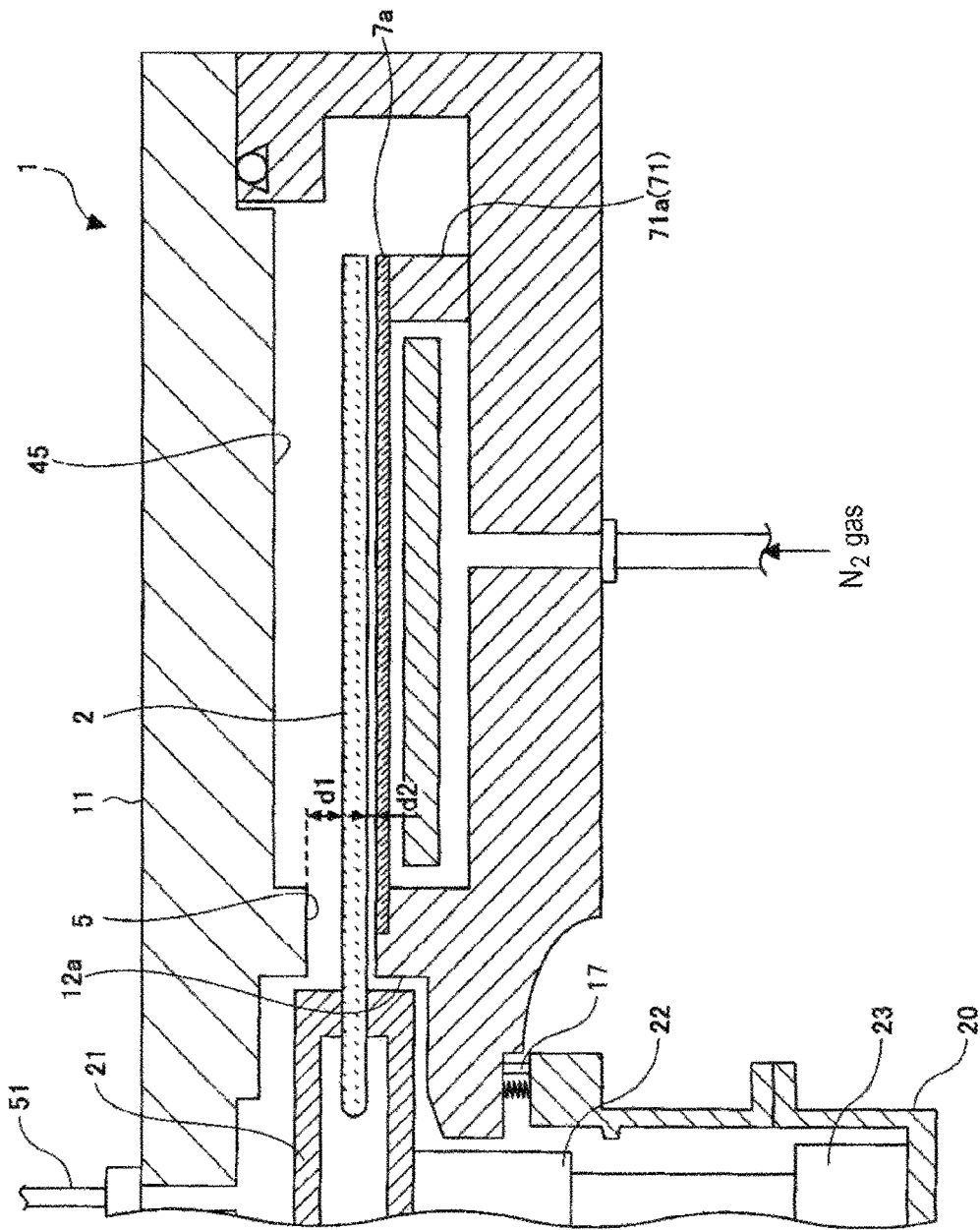
FIG. 6 is a view illustrating one example of a state in which the rotary table is moved down.

FIG. 6 is a partially-enlarged view illustrating one example of a state in which the rotary table 2 is moved down. As illustrated in FIGS. 5 and 6, when the wafer W is mounted on the rotary table 2, the rotary table 2 is moved down to maintain a space having such a distance d1 that the wafer W does not make contact with the ceiling surface 44 even if the wafer W is warped (the ceiling surface 44 and the lower surface of the protrusion portion 5 have the same height). On the other hand, when the warped portion of all of the wafers W is settled and when the wafers W are subjected to a film forming process by rotating the rotary table 2, it is necessary to maintain a narrow clearance between the wafers W and the ceiling surface 44. Thus, the film forming process is performed in a state in which the rotary table 2 is moved up. By installing the elevator mechanism 17 for moving the rotary table 2 up and down, it is possible to prevent damage of the wafers W which may otherwise be caused by the contact of the wafers W with the ceiling surfaces 44 and 45. Furthermore, even if the wafers W mounted on the rotary table 2 are still in a warped state, the wafers W can be sequentially mounted on the recess portions 24 by intermittently rotating the rotary table 2 without waiting for the warped portions to settle. This makes it possible to improve productivity. In other words, since a margin exists between the rotary table 2 and the ceiling surfaces 44 and 45, it is possible to mount one wafer W on one recess portion 24 of the rotary table 2 and then mount a subsequent wafer W on the next recess portion 24 before the warp of the mounted wafer W is settled. This makes it possible to shorten the total time required in mounting the plurality of wafers W on the rotary table 2 and to improve the productivity. In some embodiments, the distance d1 of the space between the rotary table 2 and the ceiling surface 44 may be set to fall within a range of 8 to 18 mm, specifically 10 to 15 mm More specifically, the distance d1 may be set at, for example, 13 mm.

As illustrated in FIGS. 5 and 6, when the rotary table 2 is moved down, the space having the distance d1 to the ceiling surface 44 is formed above the rotary table 2, and a distance d2 of a gap between the lower surface of the rotary table 2 and the lid member 7a is sharply reduced to, for example, about 3 mm. In this state, there is little possibility that the process gas passes through the downside of the rotary table 2. Thus, there is little possibility that the second process gas supplied to the second processing region P2 passes through the downside of the rotary table 2 and reaches the first processing region P1, after which the second process gas is exhausted from the first exhaust port 610.

FIG. 7 is a view illustrating one example of a state in which the rotary table 2 is moved up. As illustrated in FIG. 7, if the rotary table 2 is moved up, the distance d1 of the gap between the rotary table 2 and the process gas nozzles 31 and 32 is sharply reduced to, for example, about 3 mm. However, the distance d2 of the gap between the rotary table 2 and the lid member 7a grows larger. Thus, a space is formed through which the process gas can pass. As described above, the clearance (distance D2) of 3 mm is initially formed between the lower surface of the rotary table 2 and the lid member 7a. If the clearance (distance D1) of 3 mm is formed between the upper surface of the rotary table 2 and the ceiling surface 44 after the rotary table 2 is moved up, the distance d2 of the gap between the lower surface of the rotary table 2 and the lid member 7a also becomes about 8 to 18 mm, for example, 13 mm. If the wafers W are subjected to a process such as a film forming process or the like in this state, the process gas passes through a communication space formed in the downside of the rotary table 2. Thus, a phenomenon is generated such that the second process gas reaches the first processing region P1 and is exhausted from the first exhaust port 610. In this case, the first process gas and the second process gas make a chemical vapor deposition (CVD) reaction, whereby an unnecessary reaction product such as a silicon oxide film or the like is deposited in the first exhaust port 610.

In order to prevent this phenomenon, in the substrate processing method and the substrate processing apparatus according to the embodiment of the present disclosure, the exhaust pressures in the first exhaust port 610 and the second exhaust port 620 are regulated to perform control so that the second process gas is not exhausted from the first exhaust port 610 but is exhausted from the second exhaust port 620. Hereinafter, specific contents of this control will be described using simulation results.

FIG. 8 is a view for explaining basic process conditions including an arrangement state of the container body 12 in the simulation results illustrated in FIGS. 9A to 9D and the subsequent figures. The following simulation results will be indicated in a state in which as illustrated in FIG. 8, the transfer port 15 is disposed at the lower side of the drawing sheet surface, the first exhaust port 610 is disposed at the right upper end of the drawing sheet surface, and the second exhaust port 620 is disposed at the left upper end of the drawing sheet surface. A diisopropylaminosilane gas, which is one kind of a Si-containing gas, is supplied from the process gas nozzle 31 at a flow rate of 300 sccm (0.3 slm) together with an Ar gas as a carrier gas (the Ar gas is supplied at a flow rate of 1,000 sccm (1 slm)). An ozone gas is supplied from the process gas nozzle 32 at a flow rate of 6 slm. A mixed gas of an Ar gas and an oxygen gas is supplied from the plasma gas nozzle 92 at an Ar gas flow rate of 15 slm and an oxygen gas flow rate of 75 sccm. An internal pressure of the vacuum container 1 is set at 2 Torr and a temperature of the wafer W is set at 400 degrees C. An Ar gas is supplied at a flow rate of 3 slm from the separation gas supply pipe 51 disposed above the rotary shaft 22. An Ar gas is supplied at a flow rate of 10 slm from the purge gas supply pipe 72. An Ar gas is supplied at a flow rate of 5 slm from the separation gas nozzles 41 and 42.

In this regard, the process gas nozzle 31 exists within the first processing region P1 and the process gas nozzle 32 exists within the second processing region P2. The second processing region P2 has an area three times or more as large as the area of the first processing region P1. For example, an aperture angle of the first processing region P1 is about 30 to 60 degrees, whereas the aperture angle of the second processing region P2 is about 120 to 270 degrees. Typically, the aperture angle of the first processing region P1 is set at about 75 degrees and the aperture angle of the second processing region P2 is set at about 165 degrees. The first and second exhaust ports 610 and 620 exist at the downstream ends of the first and second processing regions P1 and P2 in the rotational direction of the rotary table 2. The process gas nozzle 32 exists at the upstream end of the second processing region P2. Thus, the distance between the process gas nozzle 32 and the first exhaust port 610 is smaller than the distance between the process gas nozzle 32 and the second exhaust port 620.

By differently changing the conditions including the exhaust pressures in the first and second exhaust ports 610 and 620 from these basic conditions, a flow rate distribution of the ozone gas supplied from the process gas nozzle 32 and a flow rate distribution of the diisopropylaminosilane gas supplied from the process gas nozzle 32 were simulated.

Figure 9A:
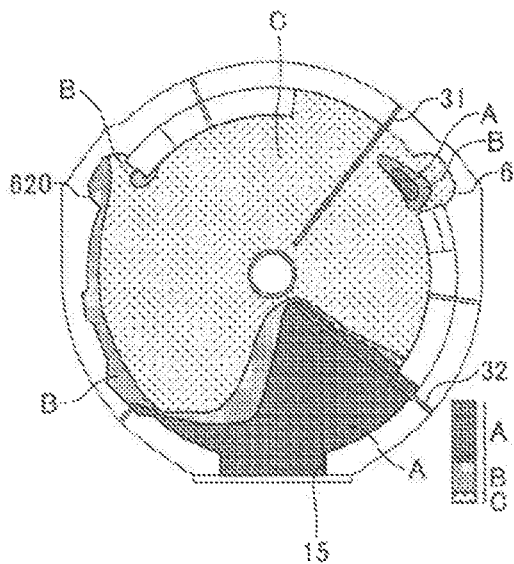
FIGS. 9A to 9D are views illustrating a first simulation result.
Figure 9B:
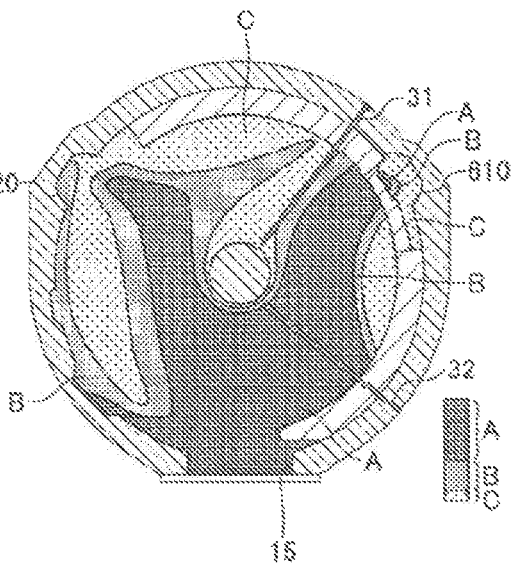

FIGS. 9A to 9D are views illustrating the simulation results obtained in a state in which the exhaust pressures in the first and second exhaust ports 610 and 620 are equally set at 2 Torr and the supply flow rate of the Ar gas supplied from the purge gas supply pipe 72 existing under the rotary shaft 22 is reduced to 1.8 slm. FIG. 9A is a view illustrating the simulation result of an oxygen concentration in the upside of the rotary table 2. FIG. 9B is a view illustrating the simulation result of an oxygen concentration in the downside of the rotary table 2. A region in which the oxygen concentration is detected as being dense is indicated by level A. A region in which the oxygen concentration is not detected so much is indicated by level B. A region in which the oxygen concentration is hardly detected is indicated by level C.

As illustrated in FIG. 9A, in the upside of the rotary table 2, 60% of the oxygen concentration was detected in the first exhaust port 610. It was recognized that a small amount of the ozone gas is infiltrated into the first exhaust port 610.

On the other hand, as illustrated in FIG. 9B, it can be noted that in the downside of the rotary table 2, the ozone gas reaches the second exhaust port 620 and also reaches the first exhaust port 610. That is to say, although it is essentially required that the entire ozone gas is exhausted from the second exhaust port 620, a significant amount of the ozone gas is exhausted from the first exhaust port 610.

Figure 9C:
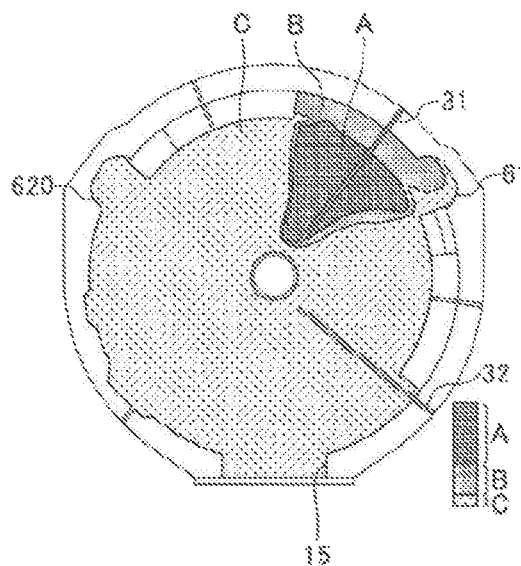
Figure 9D:
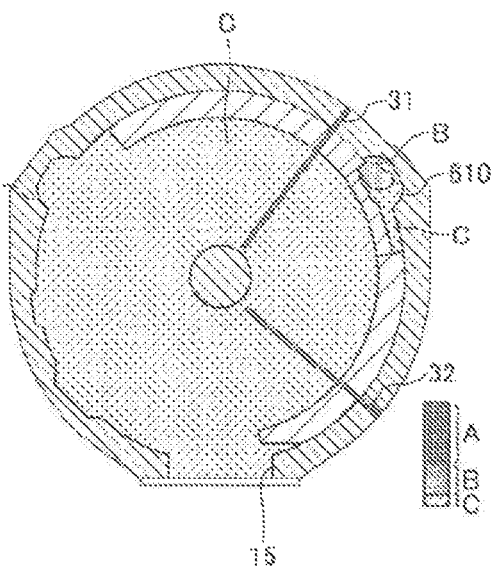

FIG. 9C is a view illustrating the simulation result of a diisopropylaminosilane concentration in the upside of the rotary table 2. FIG. 9D is a view illustrating the simulation result of a diisopropylaminosilane concentration in the downside of the rotary table 2. A region in which the diisopropylaminosilane concentration is detected as being dense is indicated by level A. A region in which the diisopropylaminosilane concentration is not detected so much is indicated by level B. A region in which the diisopropylaminosilane concentration is hardly detected is indicated by level C.

As illustrated in FIG. 9C, it can be noted that in the upside of the rotary table 2, the diisopropylaminosilane gas is supplied to the first processing region P1 and is appropriately exhausted from the first exhaust port 610.

Furthermore, as illustrated in FIG. 9D, it can be noted that in the downside of the rotary table 2, the concentration of the diisopropylaminosilane gas in the first exhaust port 610 is at level B which does not matter.

It can be seen that if the exhaust pressures in the first exhaust port 610 and the second exhaust port 620 are equally set at 2 Torr in this way, the ozone gas is infiltrated into the first exhaust port 610 in the downside of the rotary table 2.

Figure 10A:
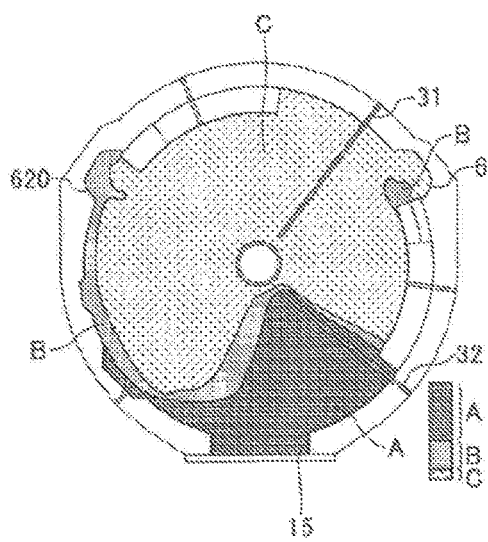
FIGS. 10A to 10D are views illustrating a second simulation result.
Figure 10B:
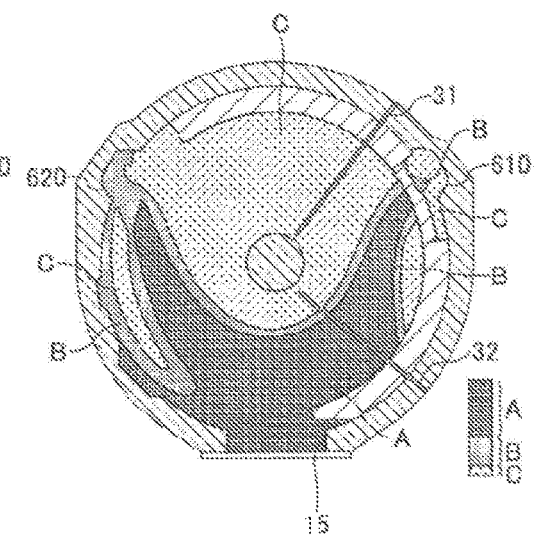

FIGS. 10A to 10D are views illustrating the simulation results obtained in a state in which the exhaust pressures in the first and second exhaust ports 610 and 620 are equally set at 2 Torr and the supply flow rate of the Ar gas supplied from the purge gas supply pipe 72 existing under the rotary shaft 22 is increased to 10 slm. FIG. 10A is a view illustrating the simulation result of an oxygen concentration in the upside of the rotary table 2. FIG. 10B is a view illustrating the simulation result of an oxygen concentration in the downside of the rotary table 2. As in FIGS. 9A and 9B, a region in which the oxygen concentration is detected as being dense is indicated by level A. A region in which the oxygen concentration is not detected so much is indicated by level B. A region in which the oxygen concentration is hardly detected is indicated by level C.

As illustrated in FIG. 10A, in the upside of the rotary table 2, 40% of the oxygen concentration was detected in the first exhaust port 610. It can be noted that by increasing the flow rate of the Ar gas supplied from the downside of the rotary shaft 22, it is possible to slightly reduce the amount of the Ar gas infiltrated into the first exhaust port 610 as compared with the case illustrated in FIG. 9A. However, a small amount of the ozone gas infiltrated into the first exhaust port 610 exists.

Furthermore, as illustrated in FIG. 10B, it can be noted that while the dispersion of the oxygen concentration is reduced in the downside of the rotary table 2 as compared with the case illustrated in FIG. 9B, the ozone gas still reaches both the first exhaust port 610 and the second exhaust port 620. That is to say, although it is essentially required that the entire ozone gas is exhausted from the second exhaust port 620, a significant amount of the ozone gas is exhausted from the first exhaust port 610 as in the case illustrated in FIG. 9B.

Figure 10C:
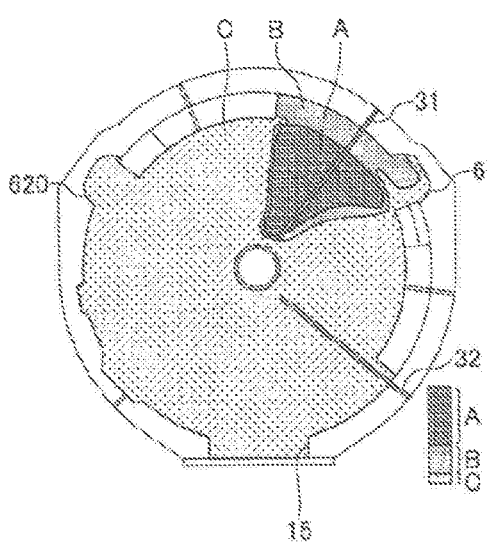
Figure 10D:
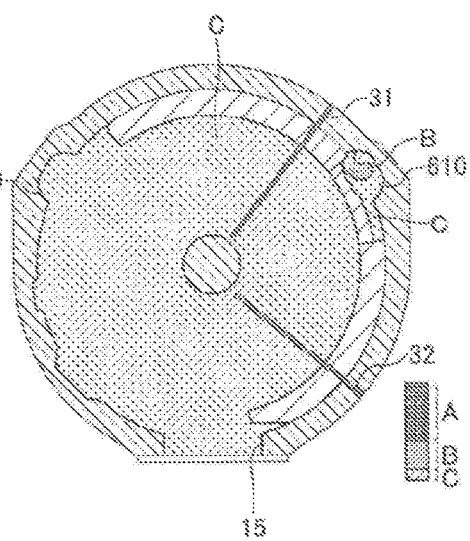

FIG. 10C is a view illustrating the simulation result of a diisopropylaminosilane concentration in the upside of the rotary table 2. FIG. 10D is a view illustrating the simulation result of a diisopropylaminosilane concentration in the downside of the rotary table 2. As in FIGS. 9C and 9D, a region in which the diisopropylaminosilane concentration is detected as being dense is indicated by level A. A region in which the diisopropylaminosilane concentration is not detected so much is indicated by level B. A region in which the diisopropylaminosilane concentration is hardly detected is indicated by level C.

As illustrated in FIG. 10C, it can be noted that in the upside of the rotary table 2, the diisopropylaminosilane gas is supplied to the first processing region P1 and is appropriately exhausted from the first exhaust port 610.

Furthermore, as illustrated in FIG. 10D, it can be noted that in the downside of the rotary table 2, the concentration of the diisopropylaminosilane gas in the first exhaust port 610 is at level B which does not matter.

It can be seen that if the exhaust pressures in the first exhaust port 610 and the second exhaust port 620 are equally set at 2 Torr in this way, the ozone gas is infiltrated into the first exhaust port 610 in the downside of the rotary table 2 even when the amount of the purge gas supplied from the downside of the rotary shaft 22 is increased.

Figure 11A:
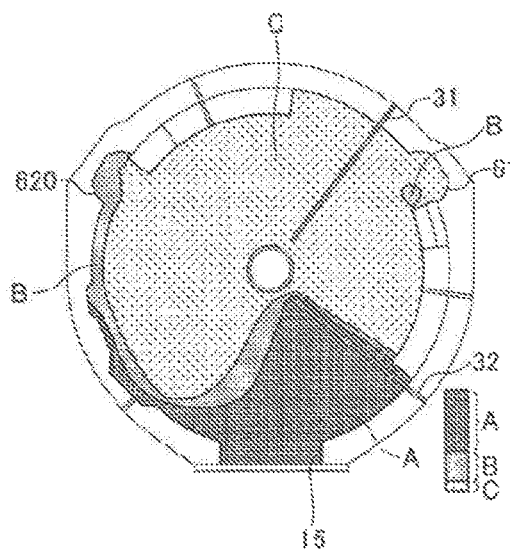
FIGS. 11A to 11D are views illustrating a third simulation result.
Figure 11B:
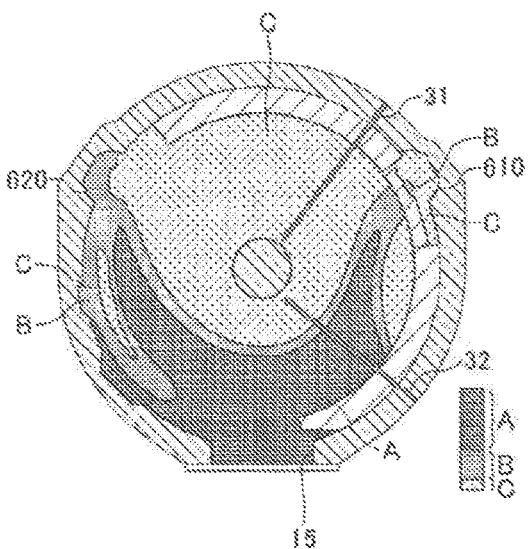

FIGS. 11A to 11D are views illustrating the simulation results obtained in a state in which the exhaust pressure in the first exhaust port 610 is set at 2.1 Torr and the exhaust pressure in the second exhaust port 620 is set at 2 Torr so that a pressure difference of 0.1 Torr exists. FIG. 11A is a view illustrating the simulation result of an oxygen concentration in the upside of the rotary table 2. FIG. 11B is a view illustrating the simulation result of an oxygen concentration in the downside of the rotary table 2. As in FIGS. 9A and 9B and FIGS. 10A and 10B, a region in which the oxygen concentration is detected as being dense is indicated by level A. A region in which the oxygen concentration is not detected so much is indicated by level B. A region in which the oxygen concentration is hardly detected is indicated by level C.

As illustrated in FIG. 11A, it can be noted that in the upside of the rotary table 2, the oxygen concentration detected in the first exhaust port 610 is nothing more than level B and the infiltration of the ozone gas is not generated so much.

Furthermore, as illustrated in FIG. 11B, it can be noted that while the dispersion of the oxygen concentration is reduced in the downside of the rotary table 2 as compared with the case illustrated in FIG. 10B, a small amount of the ozone gas reaches the first exhaust port 610. That is to say, although it is essentially required that the entire ozone gas is exhausted from the second exhaust port 620, a small amount of the ozone gas is exhausted from the first exhaust port 610.

Figure 11C:
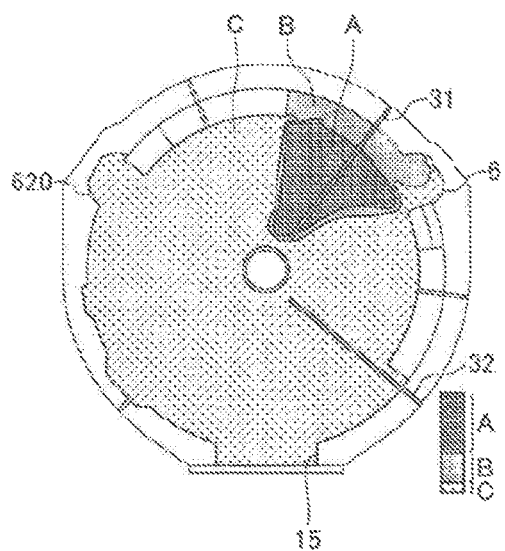
Figure 11D:
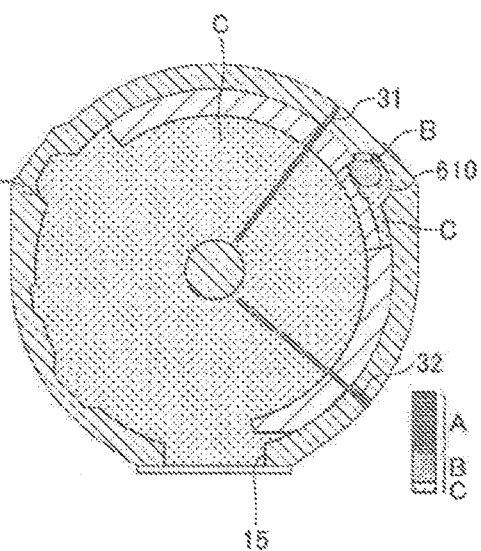

FIG. 11C is a view illustrating the simulation result of a diisopropylaminosilane concentration in the upside of the rotary table 2. FIG. 11D is a view illustrating the simulation result of a diisopropylaminosilane concentration in the downside of the rotary table 2. As in FIGS. 9C and 9D and FIGS. 10C and 10D, a region in which the diisopropylaminosilane concentration is detected as being dense is indicated by level A. A region in which the diisopropylaminosilane concentration is not detected so much is indicated by level B. A region in which the diisopropylaminosilane concentration is hardly detected is indicated by level C.

As illustrated in FIG. 11C, it can be noted that in the upside of the rotary table 2, the diisopropylaminosilane gas is supplied to the first processing region P1 and is appropriately exhausted from the first exhaust port 610.

Furthermore, as illustrated in FIG. 11D, it can be noted that in the downside of the rotary table 2, the concentration of the diisopropylaminosilane gas in the first exhaust port 610 is at level B which does not matter.

It can be noted that if the exhaust pressure in the first exhaust port 610 is set at 2.1 Torr and the exhaust pressure in the second exhaust port 620 is set at 2 Torr so that a pressure difference of 0.1 Torr exists in this way, a small amount of the ozone gas is infiltrated into the first exhaust port 610 in the downside of the rotary table 2 although improvement is seen.

Figure 12A:
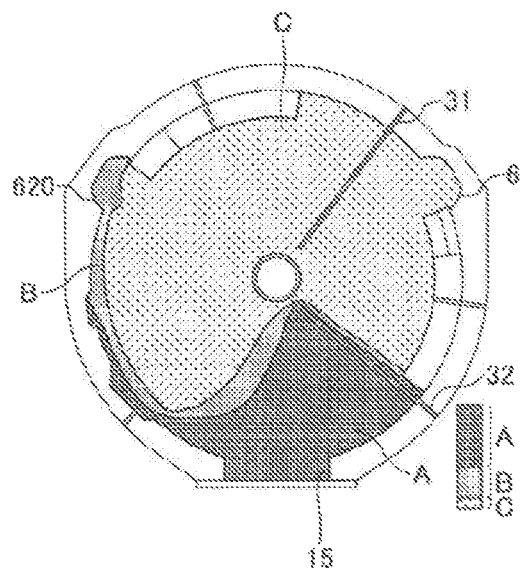
FIGS. 12A to 12D are views illustrating a fourth simulation result.
Figure 12B:
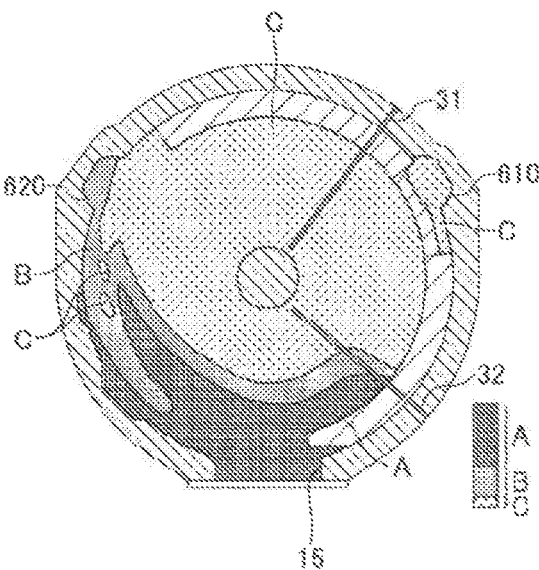

FIGS. 12A to 12D are views illustrating the simulation results obtained in a state in which the exhaust pressure in the first exhaust port 610 is set at 2.2 Torr and the exhaust pressure in the second exhaust port 620 is set at 2 Torr so that a pressure difference of 0.2 Torr exists. FIG. 12A is a view illustrating the simulation result of an oxygen concentration in the upside of the rotary table 2. FIG. 12B is a view illustrating the simulation result of an oxygen concentration in the downside of the rotary table 2. As in FIGS. 9A and 9B, FIGS. 10A and 10B and FIGS. 11A and 11B, a region in which the oxygen concentration is detected as being dense is indicated by level A. A region in which the oxygen concentration is not detected so much is indicated by level B. A region in which the oxygen concentration is hardly detected is indicated by level C.

As illustrated in FIG. 12A, it can be noted that in the upside of the rotary table 2, the oxygen concentration detected in the first exhaust port 610 is nothing more than level C and the infiltration of the ozone gas is hardly seen.

Furthermore, as illustrated in FIG. 12B, even in the downside of the rotary table 2, the ozone gas does not reach the first exhaust port 610 and reaches only the second exhaust port 620. In this way, the ozone gas as the second process gas is exhausted only from the second exhaust port 620. It can be noted that the essentially required state is achievable.

Figure 12C:
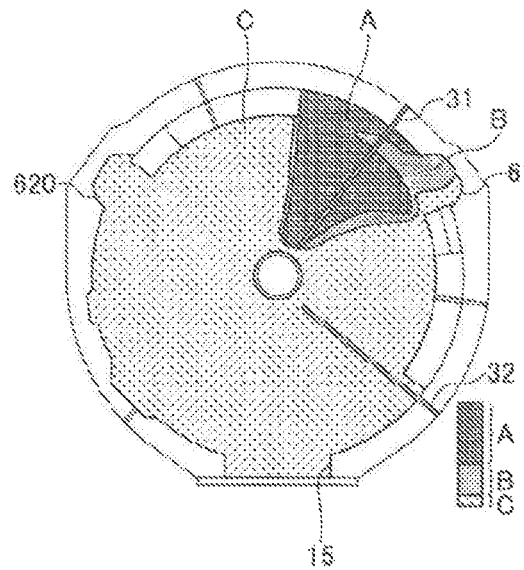
Figure 12D:
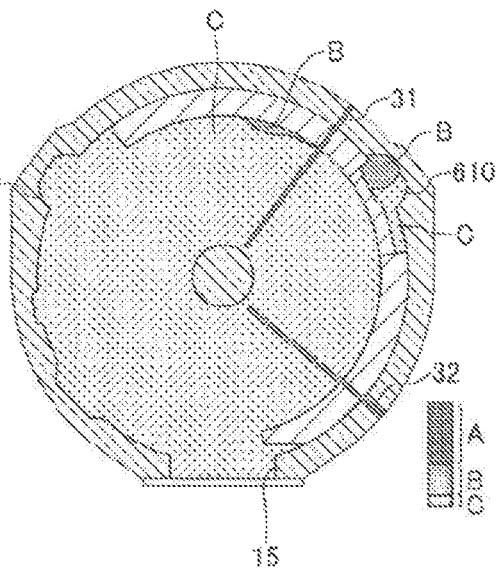

FIG. 12C is a view illustrating the simulation result of a diisopropylaminosilane concentration in the upside of the rotary table 2. FIG. 12D is a view illustrating the simulation result of a diisopropylaminosilane concentration in the downside of the rotary table 2. As in FIGS. 9C and 9D, FIGS. 10C and 10D and FIGS. 11C and 11D, a region in which the diisopropylaminosilane concentration is detected dense is indicated by level A. A region in which the diisopropylaminosilane concentration is not detected so much is indicated by level B. A region in which the diisopropylaminosilane concentration is hardly detected is indicated by level C.

As illustrated in FIG. 12C, it can be noted that in the upside of the rotary table 2, the diisopropylaminosilane gas is supplied to the first processing region P1 and is appropriately exhausted from the first exhaust port 610.

Furthermore, as illustrated in FIG. 12D, it can be noted that even in the downside of the rotary table 2, the concentration of the diisopropylaminosilane gas in the first exhaust port 610 is at level B which does not matter.

It can be seen that if the exhaust pressure in the first exhaust port 610 is set at 2.2 Torr and the exhaust pressure in the second exhaust port 620 is set at 2 Torr so that a pressure difference of 0.2 Torr exists in this way, it is possible to prevent the ozone gas from infiltrating into the first exhaust port 610 in the downside of the rotary table 2.

Figure 13A:
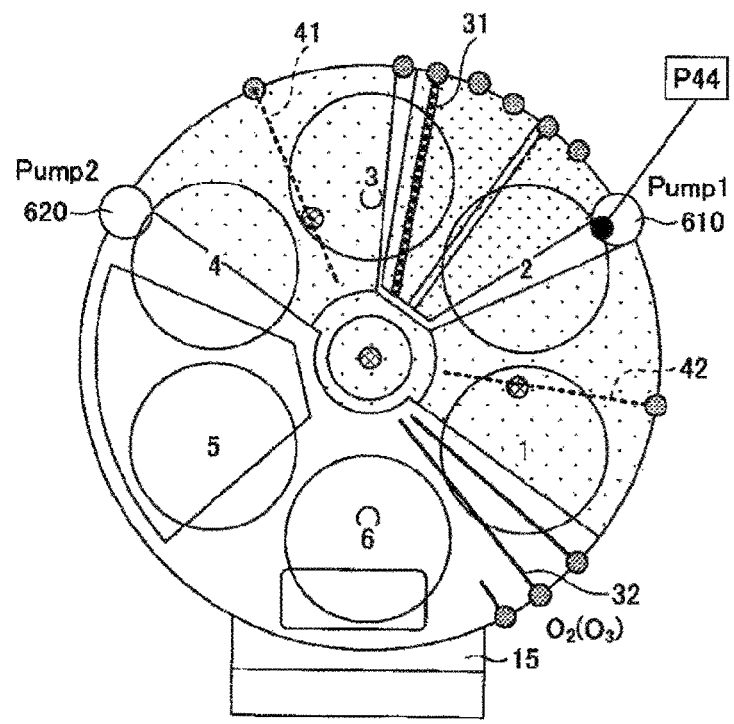
FIGS. 13A and 13B are views for explaining an example of the present disclosure.
Figure 13B:
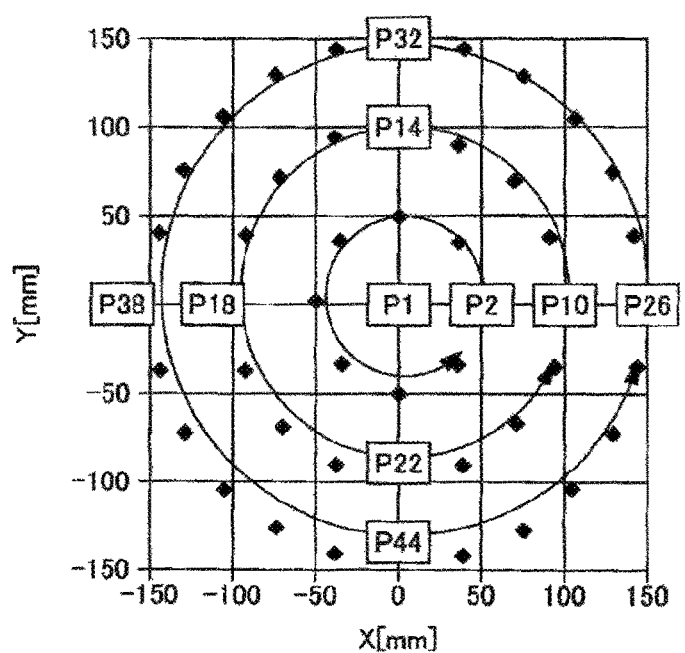

FIGS. 13A and 13B are views for explaining an example in which six wafers W are mounted on the rotary table 2 without rotating the rotary table 2 and a film forming process is performed by changing the exhaust pressure conditions of the first and second exhaust ports 610 and 620. FIG. 13A is a view illustrating the arrangement positions of the wafers W. FIG. 13B is a view illustrating film thickness measurement points.

A simulation was performed in a state in which as illustrated in FIG. 13A, the transfer port 15 is disposed at the lower side, the first exhaust port 610 is disposed at the right upper portion, the second exhaust port 620 is disposed at the left upper portion, the process gas nozzle 31 is disposed at the right upper portion, and the process gas nozzle 32 is disposed at the right lower portion.

Furthermore, as illustrated in FIG. 13B, 49 film thickness measurement points P1 to P49 were set. The film thickness measurement points are disposed in three rows in the radial direction. On the respective rows, the film thickness measurement points are substantially uniformly disposed over a range of 360 degrees. Furthermore, as illustrated in FIG. 13A, the first exhaust port 610 is disposed in the vicinity of the film thickness measurement point P44.

Figure 14:
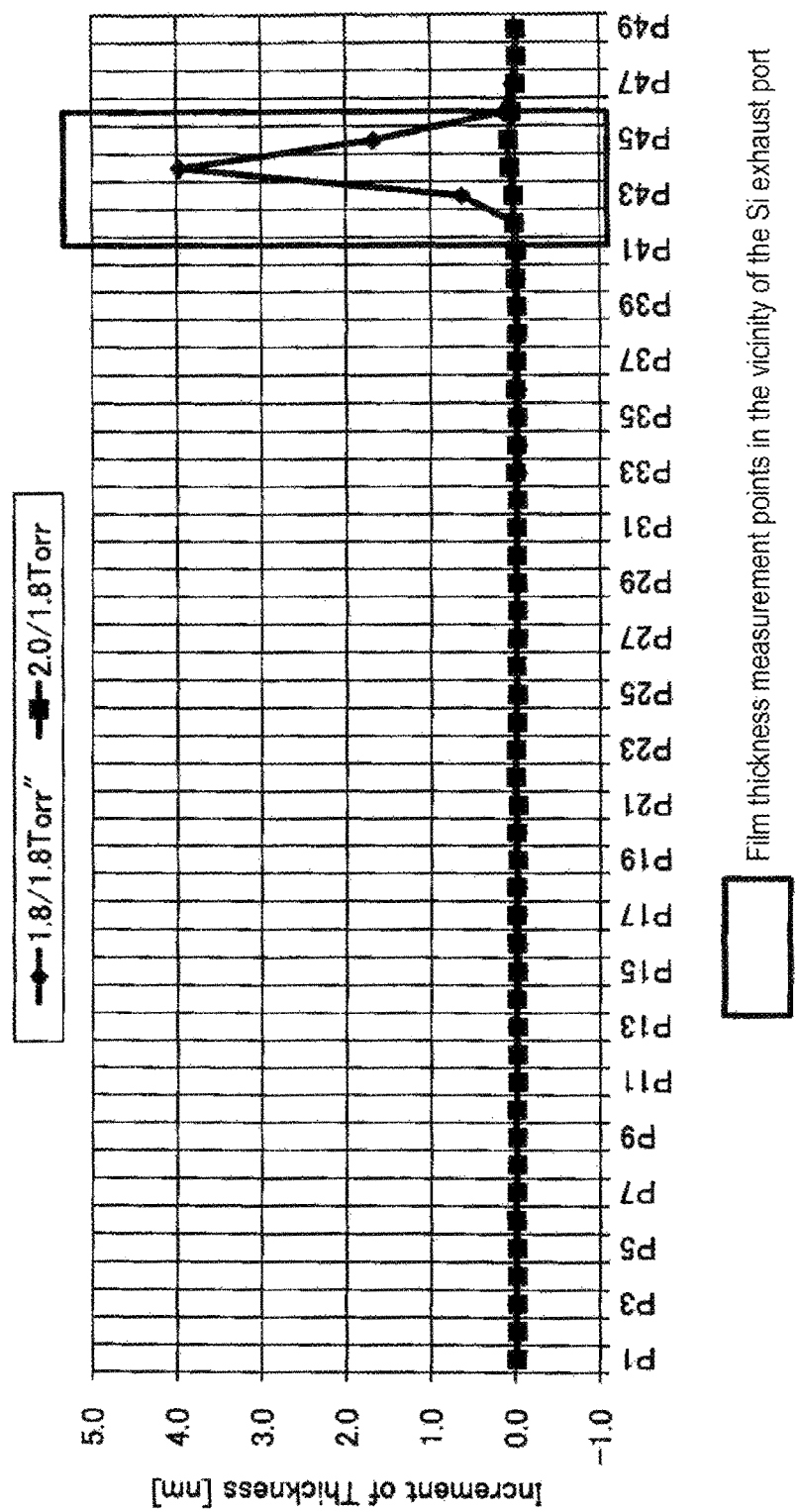
FIG. 14 is a view illustrating a result of the example illustrated in FIGS. 13A and 13B.

FIG. 14 is a view illustrating the results of the example illustrated in FIGS. 13A and 13B. As illustrated in FIG. 14, when the exhaust pressures in the first exhaust port 610 and the second exhaust port 620 are equally set at 1.8 Torr, the film thickness was increased in the vicinity of the film thickness measurement points P42 to P46. This means that a CVD reaction was generated in the vicinity of the first exhaust port 610 since the film thickness measurement points P42 to P46 exist near the first exhaust port 610.

On the other hand, when the exhaust pressure in the first exhaust port 610 is set at 2.0 Torr and the exhaust pressure in the second exhaust port 620 is set at 1.8 Torr, the film thickness was not increased even in the vicinity of the film thickness measurement points P42 to P46 and the film formation was not generated at all. This means that the second process gas was not infiltrated into the first exhaust port 610.

As described above, it can be noted from this example that when the exhaust pressure in the first exhaust port 610 and the exhaust pressure in the second exhaust port 620 are set at about 2.0 Torr, it is possible to prevent the mixed exhaust of the second process gas from the first exhaust port 610 by setting the exhaust pressure in the first exhaust port 610 higher than the exhaust pressure in the second exhaust port 620 so that a 10% pressure difference of 0.2 Torr exists.

Figure 15A:
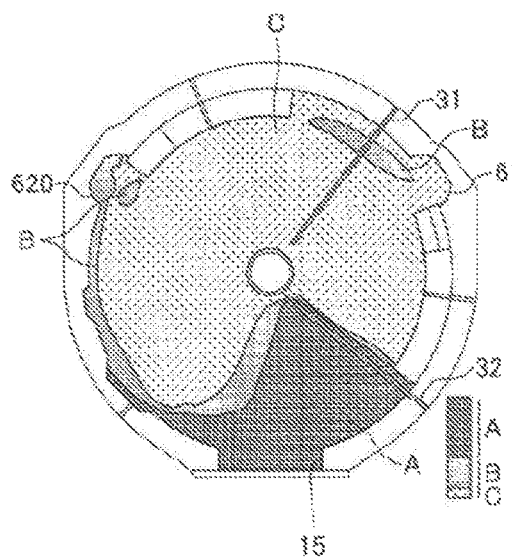
FIGS. 15A to 15D are views illustrating a fifth simulation result.
Figure 15B:
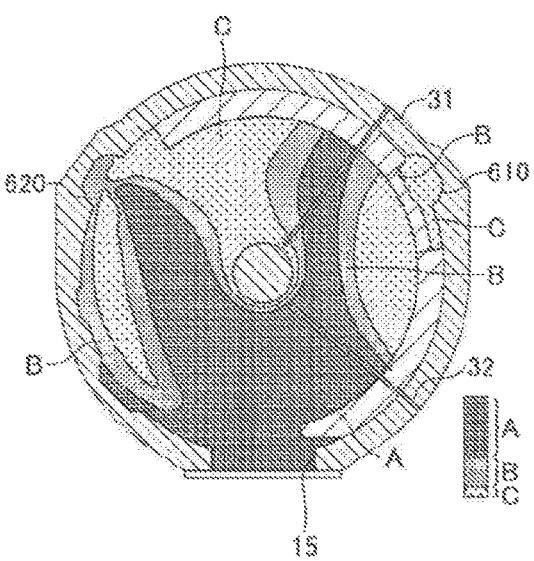

FIGS. 15A to 15D are views illustrating the simulation results obtained in the case where the exhaust pressures in the first and second exhaust ports 610 and 620 are equally set at 4 Torr without generating a pressure difference. FIG. 15A is a view illustrating the simulation result of an oxygen concentration in the upside of the rotary table 2. FIG. 15B is a view illustrating the simulation result of an oxygen concentration in the downside of the rotary table 2. As in FIGS. 9A and 9B, FIGS. 10A and 10B, FIGS. 11A and 11B and FIGS. 12A and 12B, a region in which the oxygen concentration is detected as being dense is indicated by level A. A region in which the oxygen concentration is not detected so much is indicated by level B. A region in which the oxygen concentration is hardly detected is indicated by level C.

As illustrated in FIG. 15A, it can be noted that in the upside of the rotary table 2, the oxygen concentration detected in the first exhaust port 610 is nothing more than level B and the infiltration of the ozone gas is not seen so much.

On the other hand, as illustrated in FIG. 15B, it can be noted that in the downside of the rotary table 2, the ozone gas reaches the second exhaust port 620 and also reaches the vicinity of the first exhaust port 610. That is to say, although it is essentially required that the entire ozone gas is exhausted from the second exhaust port 620, the ozone gas is also exhausted from the first exhaust port 610.

Figure 15C:
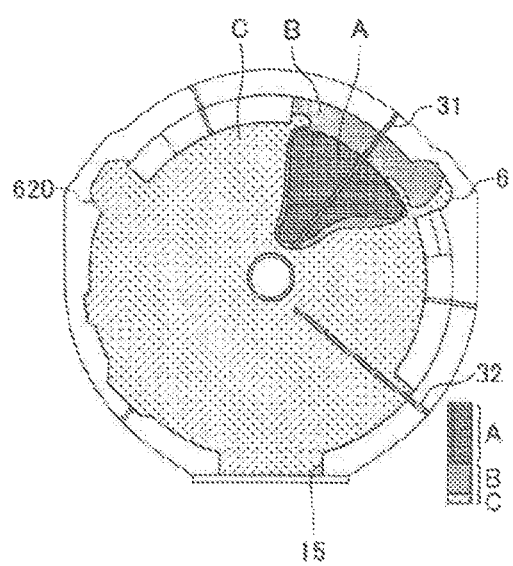
Figure 15D:
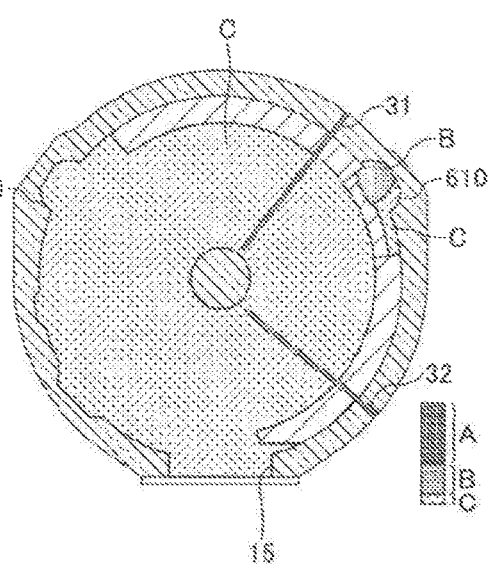

FIG. 15C is a view illustrating the simulation result of a diisopropylaminosilane concentration in the upside of the rotary table 2. FIG. 15D is a view illustrating the simulation result of a diisopropylaminosilane concentration in the downside of the rotary table 2. As in FIGS. 9C and 9D, FIGS. 10C and 10D, FIGS. 11C and 11D and FIGS. 12C and 12D, a region in which the diisopropylaminosilane concentration is detected as being dense is indicated by level A. A region in which the diisopropylaminosilane concentration is not detected so much is indicated by level B. A region in which the diisopropylaminosilane concentration is hardly detected is indicated by level C.

As illustrated in FIG. 15C, it can be noted that in the upside of the rotary table 2, the diisopropylaminosilane gas is supplied to the first processing region P1 and is appropriately exhausted from the first exhaust port 610.

Furthermore, as illustrated in FIG. 15D, it can be noted that in the downside of the rotary table 2, the concentration of the diisopropylaminosilane gas in the first exhaust port 610 is at level B which does not matter.

In the case where the exhaust pressures in the first and second exhaust ports 610 and 620 are equally set at 4 Torr so that a pressure difference does not exist in this way, no problem is posed on the rotary table 2. However, it can be noted that in the downside of the rotary table 2, the ozone gas as the second process gas is likely to be infiltrated into the first exhaust port 610.

Figure 16A:
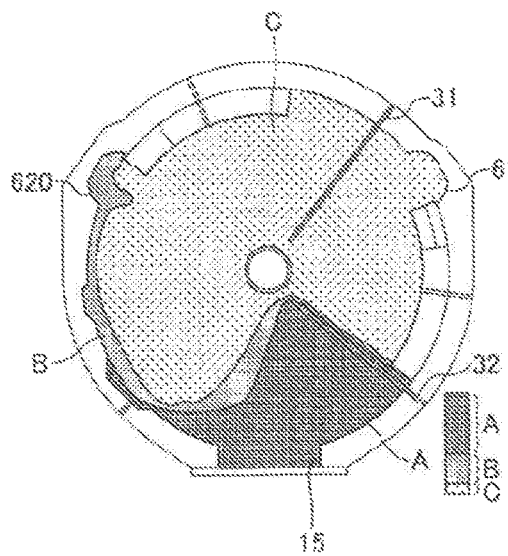
FIGS. 16A to 16D are views illustrating a sixth simulation result.
Figure 16B:
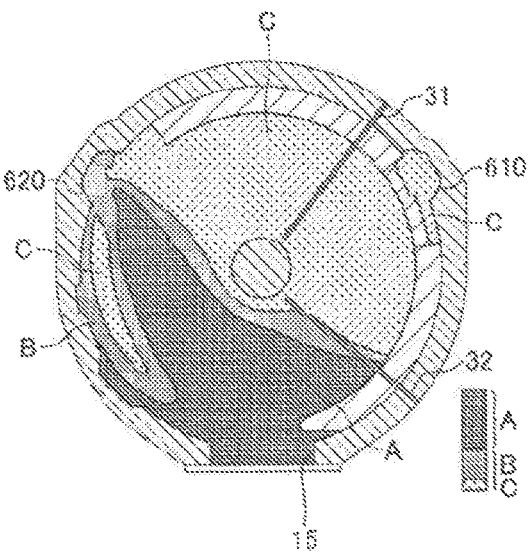

FIGS. 16A to 16D are views illustrating the simulation results obtained in a state in which the exhaust pressure in the first exhaust port 610 is set at 4.075 Torr and the exhaust pressure in the second exhaust port 620 is set at 4 Torr so that a pressure difference of 0.75 Torr exists. FIG. 16A is a view illustrating the simulation result of an oxygen concentration in the upside of the rotary table 2. FIG. 16B is a view illustrating the simulation result of an oxygen concentration in the downside of the rotary table 2. As in FIGS. 9A and 9B, FIGS. 10A and 10B, FIGS. 11A and 11B and FIGS. 12A and 12B, a region in which the oxygen concentration is detected as being dense is indicated by level A. A region in which the oxygen concentration is not detected so much is indicated by level B. A region in which the oxygen concentration is hardly detected is indicated by level C.

As illustrated in FIG. 16A, it can be noted that in the upside of the rotary table 2, the oxygen concentration detected in the first exhaust port 610 is nothing more than level C and the infiltration of the ozone gas is hardly seen.

Furthermore, as illustrated in FIG. 16B, even in the downside of the rotary table 2, the ozone gas does not reach the first exhaust port 610 and reaches only the second exhaust port 620. In this way, the ozone gas as the second process gas is exhausted only from the second exhaust port 620. It can be noted that the essentially required state is achievable.

Figure 16C:
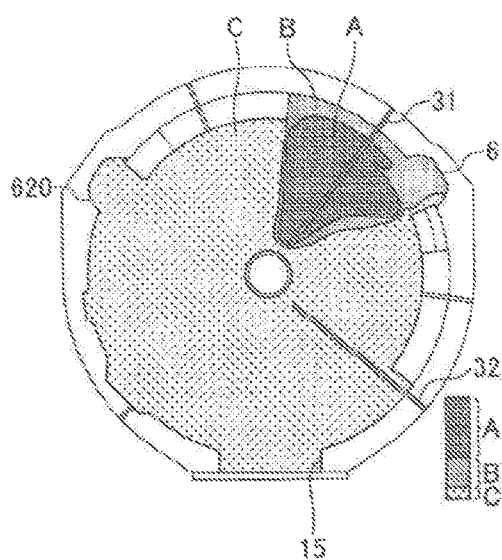
Figure 16D:
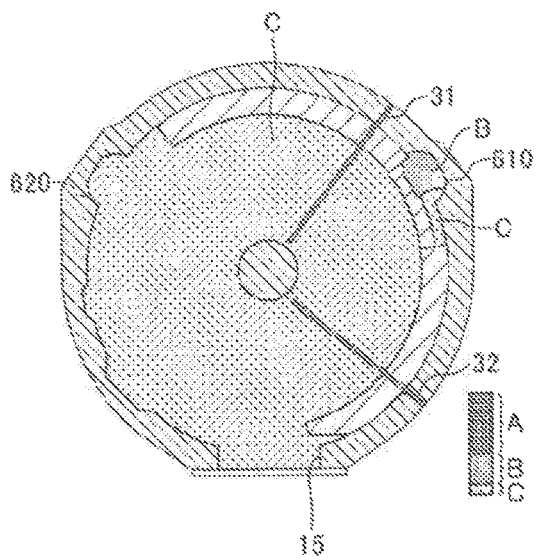

FIG. 16C is a view illustrating the simulation result of a diisopropylaminosilane concentration in the upside of the rotary table 2. FIG. 16D is a view illustrating the simulation result of a diisopropylaminosilane concentration in the downside of the rotary table 2. As in FIGS. 9C and 9D, FIGS. 10C and 10D, FIGS. 11C and 11D and FIGS. 12C and 12D, a region in which the diisopropylaminosilane concentration is detected as being dense is indicated by level A. A region in which the diisopropylaminosilane concentration is not detected so much is indicated by level B. A region in which the diisopropylaminosilane concentration is hardly detected is indicated by level C.

As illustrated in FIG. 16C, it can be noted that in the upside of the rotary table 2, the diisopropylaminosilane gas is supplied to the first processing region P1 and is appropriately exhausted from the first exhaust port 610.

Furthermore, as illustrated in FIG. 16D, it can be noted that even in the downside of the rotary table 2, the concentration of the diisopropylaminosilane gas in the first exhaust port 610 is at level B which does not matter.

It can be seen that if the exhaust pressure in the first exhaust port 610 is set at 4.075 Torr and the exhaust pressure in the second exhaust port 620 is set at 4 Torr so that a pressure difference of 0.75 Torr exists under the condition of the exhaust pressure of about 4 Torr in this way, it is possible to prevent the ozone gas from infiltrating into the first exhaust port 610 in the downside of the rotary table 2.

Figure 17A:
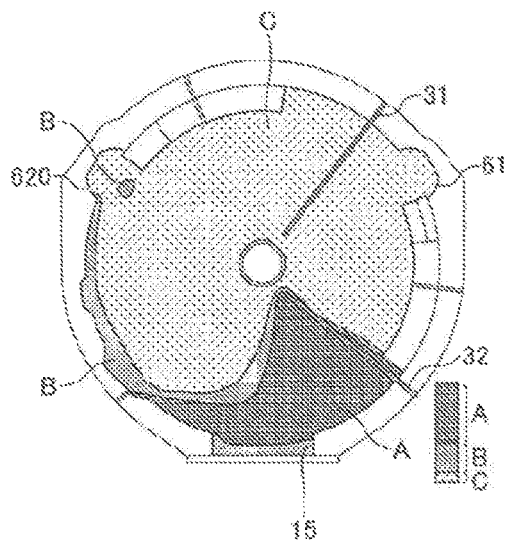
FIGS. 17A to 17D are views illustrating a seventh simulation result.
Figure 17B:
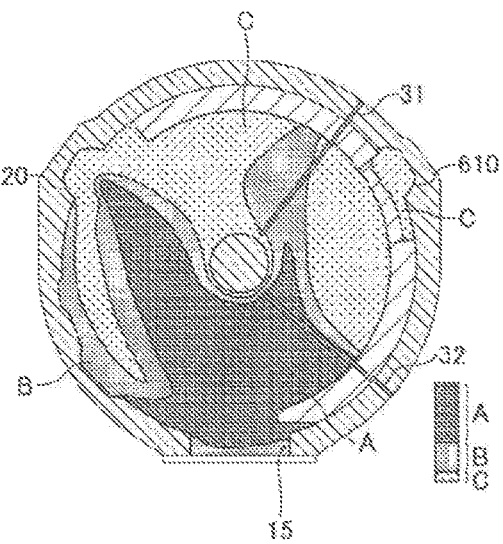

FIGS. 17A to 17D are views illustrating the simulation results obtained in the case where the exhaust pressures in the first and second exhaust ports 610 and 620 are equally set at 7 Torr so that a pressure difference does not exist. As other film forming conditions, the supply flow rate of the Ar gas supplied from the purge gas supply pipe 72 was reduced to 6 slm and the supply flow rate of the Ar gas supplied from the separation gas nozzles 41 and 42 was increased to 8 slm. FIG. 17A is a view illustrating the simulation result of an oxygen concentration in the upside of the rotary table 2. FIG. 17B is a view illustrating the simulation result of an oxygen concentration in the downside of the rotary table 2. As in FIGS. 9A and 9B, FIGS. 10A and 10B, FIGS. 11A and 11B and FIGS. 12A and 12B, a region in which the oxygen concentration is detected as being dense is indicated by level A. A region in which the oxygen concentration is not detected so much is indicated by level B. A region in which the oxygen concentration is hardly detected is indicated by level C.

As illustrated in FIG. 17A, it can be noted that in the upside of the rotary table 2, the oxygen concentration detected in the first exhaust port 610 is nothing more than level C and the infiltration of the ozone gas is hardly seen.

On the other hand, as illustrated in FIG. 17B, it can be noted that in the downside of the rotary table 2, the ozone gas reaches the second exhaust port 620 and also reaches the vicinity of the first exhaust port 610. That is to say, although it is essentially required that the entire ozone gas is exhausted from the second exhaust port 620, the ozone gas may also be exhausted from the first exhaust port 610.

Figure 17C:
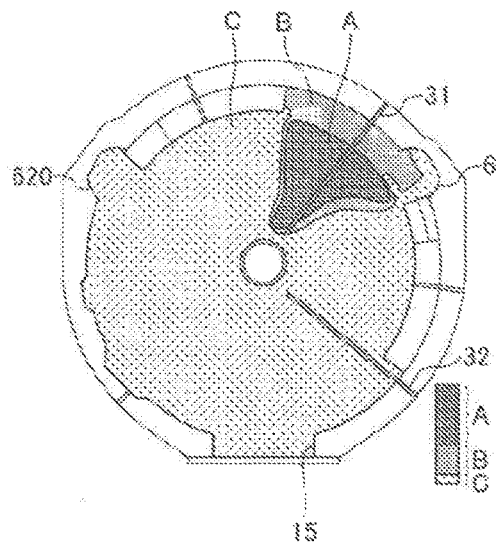
Figure 17D:
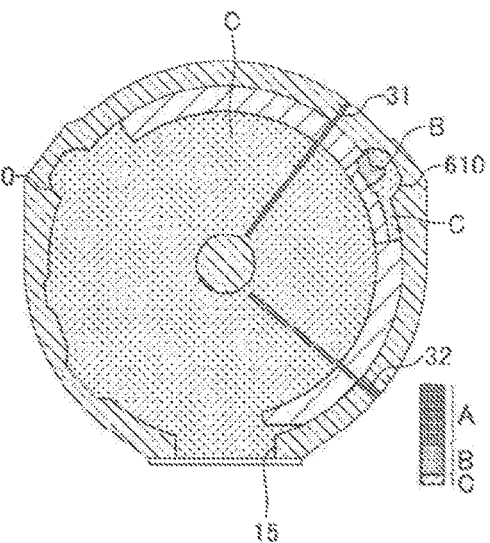

FIG. 17C is a view illustrating the simulation result of a diisopropylaminosilane concentration in the upside of the rotary table 2. FIG. 17D is a view illustrating the simulation result of a diisopropylaminosilane concentration in the downside of the rotary table 2. As in FIGS. 9C and 9D, FIGS. 10C and 10D, FIGS. 11C and 11D and FIGS. 12C and 12D, a region in which the diisopropylaminosilane concentration is detected as being dense is indicated by level A. A region in which the diisopropylaminosilane concentration is not detected so much is indicated by level B. A region in which the diisopropylaminosilane concentration is hardly detected is indicated by level C.

As illustrated in FIG. 17C, it can be noted that in the upside of the rotary table 2, the diisopropylaminosilane gas is supplied to the first processing region P1 and is appropriately exhausted from the first exhaust port 610.

Furthermore, as illustrated in FIG. 17D, it can be noted that even in the downside of the rotary table 2, the concentration of the diisopropylaminosilane gas in the first exhaust port 610 is at level B which does not matter.

In the case where the exhaust pressures in the first and second exhaust ports 610 and 620 are equally set at 7 Torr so that a pressure difference does not exist in this way, no problem is posed on the rotary table 2. However, it can be noted that in the downside of the rotary table 2, the ozone gas as the second process gas is likely to be infiltrated into the first exhaust port 610.

Figure 18A:
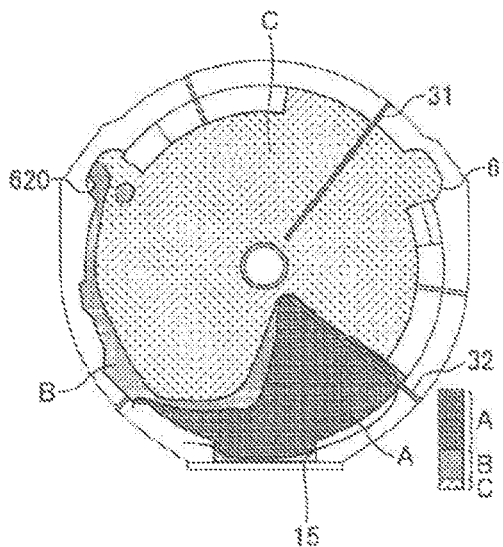
FIGS. 18A to 18D are views illustrating an eighth simulation result.
Figure 18B:
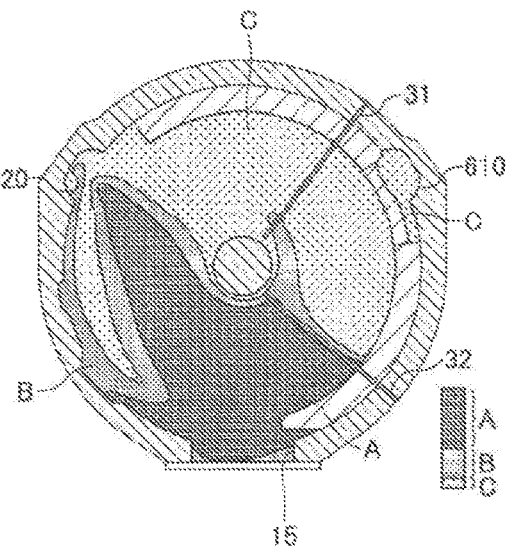

FIGS. 18A to 18D are views illustrating the simulation results obtained in a state in which the exhaust pressure in the first exhaust port 610 is set at 7.02 Torr and the exhaust pressure in the second exhaust port 620 is set at 7 Torr so that a pressure difference of 0.02 Torr exists. As other film forming conditions, the supply flow rate of the Ar gas supplied from the purge gas supply pipe 72 was reduced to 6 slm and the supply flow rate of the Ar gas supplied from the separation gas nozzles 41 and 42 was increased to 8 slm. FIG. 18A is a view illustrating the simulation result of an oxygen concentration in the upside of the rotary table 2. FIG. 18B is a view illustrating the simulation result of an oxygen concentration in the downside of the rotary table 2. As in FIGS. 9A and 9B, FIGS. 10A and 10B, FIGS. 11A and 11B and FIGS. 12A and 12B, a region in which the oxygen concentration is detected as being dense is indicated by level A. A region in which the oxygen concentration is not detected so much is indicated by level B. A region in which the oxygen concentration is hardly detected is indicated by level C.

As illustrated in FIG. 18A, it can be noted that in the upside of the rotary table 2, the oxygen concentration detected in the first exhaust port 610 is nothing more than level C and the infiltration of the ozone gas is hardly seen.

Furthermore, as illustrated in FIG. 18B, even in the downside of the rotary table 2, the ozone gas does not reach the first exhaust port 610 and reaches only the second exhaust port 620. In this way, the ozone gas as the second process gas is exhausted only from the second exhaust port 620. It can be noted that the essentially required state is achievable.

Figure 18C:
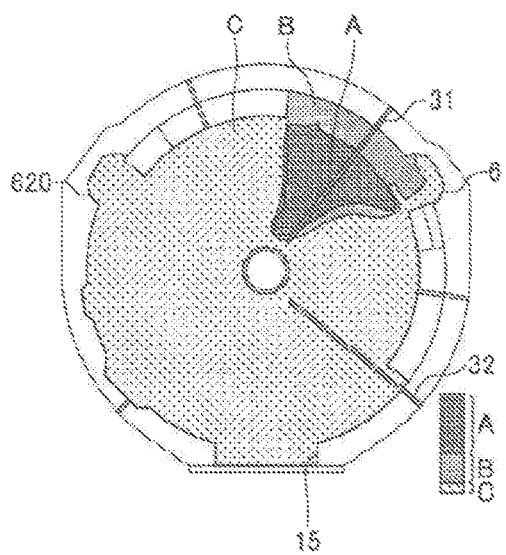
Figure 18D:
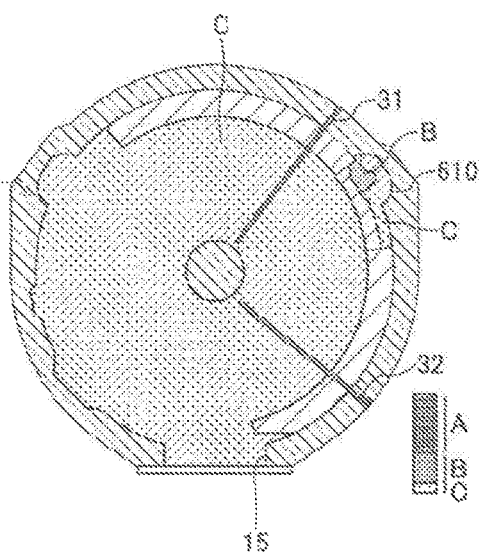

FIG. 18C is a view illustrating the simulation result of a diisopropylaminosilane concentration in the upside of the rotary table 2. FIG. 18D is a view illustrating the simulation result of a diisopropylaminosilane concentration in the downside of the rotary table 2. As in FIGS. 9C and 9D, FIGS. 10C and 10D, FIGS. 11C and 11D and FIGS. 12C and 12D, a region in which the diisopropylaminosilane concentration is detected as being dense is indicated by level A. A region in which the diisopropylaminosilane concentration is not detected so much is indicated by level B. A region in which the diisopropylaminosilane concentration is hardly detected is indicated by level C.

As illustrated in FIG. 18C, it can be noted that in the upside of the rotary table 2, the diisopropylaminosilane gas is supplied to the first processing region P1 and is appropriately exhausted from the first exhaust port 610.

Furthermore, as illustrated in FIG. 18D, it can be noted that even in the downside of the rotary table 2, the concentration of the diisopropylaminosilane gas in the first exhaust port 610 is at level B which does not matter.

It can be seen that if the exhaust pressure in the first exhaust port 610 is set at 7.02 Torr and the exhaust pressure in the second exhaust port 620 is set at 7 Torr so that a pressure difference of 0.02 Torr exists under the condition of the exhaust pressure of about 7 Torr in this way, it is possible to prevent the ozone gas from infiltrating into the first exhaust port 610 in the downside of the rotary table 2.

As described above with reference to FIGS. 12A to 14, 16A to 16D and 18A to 18D, as the exhaust pressures in the first and second exhaust ports 610 and 620 grow higher, it becomes possible to sufficiently obtain an effect of independent exhaust of the process gases even if the pressure difference between the exhaust pressure in the first exhaust port 610 and the exhaust pressure in the second exhaust port 620 is small.

It was found from simulation tests that these pressures are correlated with the internal pressure of the vacuum container 1. Specifically, the conditions depending on the internal pressure of the vacuum container 1 are as follows. When the internal pressure of the vacuum container 1 is 1 to 3 Torr, the exhaust pressure in the first exhaust port 610 may be set to fall within a pressure range which is 0.1 to 0.3 Torr higher than the exhaust pressure in the second exhaust port 620. When the internal pressure of the vacuum container 1 is 3 to 5 Torr, the exhaust pressure in the first exhaust port 610 may be set to fall within a pressure range which is 0.05 to 0.1 Torr higher than the exhaust pressure in the second exhaust port 620. When the internal pressure of the vacuum container 1 is 5 to 10 Torr, the exhaust pressure in the first exhaust port 610 may be set to fall within a pressure range which is 0.01 to 0.05 Torr higher than the exhaust pressure in the second exhaust port 620.

The exhaust pressures in the first and second exhaust ports 610 and 620 are set by controlling the pressure set values of the automatic pressure controllers 651 and 652 with the control part 100. The control part 100 can also control the internal pressure and the internal temperature of the vacuum container 1. Furthermore, the control part 100 can control the elevating operation of the rotary table 2. Thus, the substrate processing method according to the embodiment of the present disclosure can be implemented by the control using the control part 100. The operation of the control part 100 is defined by a recipe. The recipe as a computer program may be supplied in a state in which the recipe is recorded in the recording medium 102 or the like. The recipe may be installed in the memory part 101.

Next, the substrate processing method according to the first embodiment of the present disclosure will be described by taking, as an example, a case where the substrate processing method is implemented through the use of the aforementioned substrate processing apparatus. Thus, reference will be appropriately made to the drawings referred to thus far.

First, the rotary table 2 is completely moved down. In this state, the gate valve (not shown) is opened. The wafer W is transferred from the outside into the recess portion 24 of the rotary table 2 through the transfer port 15 (see FIG. 3) by the transfer arm 10. The downward movement of the rotary table 2 may be performed by controlling the elevator mechanism 17 with the control part 100. The transfer of the wafer W is performed by causing the lift pins (not shown) to move upward from the downside of the vacuum container 1 through the through-holes formed in the bottom surface of the recess portion 24 when the recess portion 24 is stopped in the position facing the transfer port 15. The transfer of the wafer W is performed by intermittently rotating the rotary table 2. Thus, the wafers W are respectively mounted into the five recess portions 24 of the rotary table 2. At this time, a warped portion may be generated in the wafer W. Since the rotary table 2 is moved down to form a space above the rotary table 2, the wafers W are mounted on the respective recess portions 24 one after another by intermittently rotating the rotary table 2 without waiting for the warped portion of the wafers W to settle. If the mounting of the wafers W is completed and if the warped portion of the wafers W is sufficiently reduced, the control part 100 controls the elevator mechanism 17 to move the rotary table 2 upward and to stop the rotary table 2 at a position suitable for performing the substrate process.

Subsequently, the gate valve is closed and the vacuum container 1 is evacuated to a lowest ultimate vacuum level by the vacuum pump 640. Thereafter, an Ar gas or a $N_2$ gas, as a separation gas, is injected at a predetermined flow rate from the separation gas nozzles 41 and 42. An Ar gas or a $N_2$ gas is also injected at a predetermined flow rate from the separation gas supply pipe 51 and the purge gas supply pipes 72 and 73. Then, the internal pressure of the vacuum container 1 is regulated to a predetermined processing pressure by the automatic pressure controllers 650 and 651. The exhaust pressures are set so that an appropriate pressure difference is generated between the exhaust pressure in the first exhaust port 610 and the exhaust pressure in the second exhaust port 620. In the aforementioned manner, the appropriate pressure difference is set depending on a preset internal pressure of the vacuum container 1.

In the case where an adsorptive raw material gas is supplied from the process gas nozzle 31 and a reaction gas reacting with the raw material gas, such as an oxidizing gas, a nitriding gas or the like, is supplied from the process gas nozzle 32, the exhaust pressure in the first exhaust port 610 installed in a corresponding relationship with the process gas nozzle 31 is set to become higher than the exhaust pressure in the second exhaust port 620. The raw material gas such as a Si-containing gas, a Ti-containing gas or the like is an adsorptive gas having a large mass and, therefore, is less likely to reach the second exhaust port 620. The reaction gas such as an oxidizing gas, a nitriding gas or the like is a diffusive gas having a small mass and, therefore, is sufficiently able to reach the first exhaust port 610. It goes without saying that the pressure relationship of the first exhaust port 610 and the second exhaust port 620 is reversed in the case where the reaction gas is supplied from the process gas nozzle 31 and the raw material gas is supplied from the process gas nozzle 32. In addition, the conditions depending on the pressure are the same as described above.

Subsequently, the wafers W are heated to, for example, 400 degrees C. by the heater unit 7, while rotating the rotary table 2 clockwise at a rotational speed of, for example, 20 rpm.

Thereafter, a Si-containing gas and an $O_3$ gas are respectively injected from the process gas nozzles 31 and 32. Furthermore, if necessary, a mixed gas of an Ar gas, an $O_2$ gas and a $H_2$ gas mixed at a predetermined flow rate ratio is supplied from the plasma gas nozzle 92 into the vacuum container 1. High-frequency power of, for example, 700 W, is supplied from a high-frequency power source to an antenna of the plasma generator 80. Thus, plasma is generated and a formed film is modified.

While the rotary table 2 makes one revolution, a silicon oxide film is formed on the wafer W in the following manner. Specifically, when the wafer W initially passes through the first processing region P1 under a first process gas nozzle 31, the Si-containing gas is adsorbed onto the surface of the wafer W. The Si-containing gas may be, for example, an organic aminosilane gas, specifically a diisopropylaminosilane gas. Then, when the wafer W passes through the second processing region P2 under a second process gas nozzle 32, the Si-containing gas existing on the wafer W is oxidized by the O3 gas supplied from the second process gas nozzle 32. Thus, one molecular layer (or several molecular layers) of silicon oxide is formed. Subsequently, when the wafer W passes through the downside of the plasma generator 80, the silicon oxide layer formed on the wafer W is exposed to active oxygen species and active hydrogen species. The active oxygen species such as oxygen radicals or the like act to oxidize, for example, an organic substance contained in the Si-containing gas and remaining in the silicon oxide layer so that the organic substance is removed from the silicon oxide layer. This makes it possible to increase the purity of the silicon oxide layer.

In the downside of the rotary table 2, there is formed a communication space through which the $O_3$ gas can reach the first exhaust port 610. However, since the exhaust pressure in the first exhaust port 610 is set higher than the exhaust pressure in the second exhaust port 620 by a predetermined pressure, the $O_3$ gas does not reach the first exhaust port 610 but is exhausted from the second exhaust port 620 together with the Ar gas or the like. Thus, it is possible to prevent formation of an unnecessary silicon oxide film in the first exhaust port 610.

If the exhaust pressure in the first exhaust port 610 is set too high, a phenomenon may occur such that the Si-containing gas reaches the second exhaust port 620. Thus, the pressure difference between the exhaust pressure in the first exhaust port 610 and the exhaust pressure in the second exhaust port 620 is set to fall within an appropriate range.

As described in the aforementioned simulation results, when the internal pressure of the vacuum container 1 is 1 to 3 Torr, the exhaust pressure in the first exhaust port 610 may be set to fall within a pressure range which is 0.1 to 0.3 Torr higher than the exhaust pressure in the second exhaust port 620. When the internal pressure of the vacuum container 1 is 3 to 5 Torr, the exhaust pressure in the first exhaust port 610 may be set to fall within a pressure range which is 0.05 to 0.1 Torr higher than the exhaust pressure in the second exhaust port 620. When the internal pressure of the vacuum container 1 is 5 to 10 Torr, the exhaust pressure in the first exhaust port 610 may be set to fall within a pressure range which is 0.01 to 0.05 Torr higher than the exhaust pressure in the second exhaust port 620.

Furthermore, as described above, if the exhaust pressure is about 2 Torr, a pressure difference of about 0.2 Torr is proper. If the exhaust pressure is about 4 Torr, a pressure difference of about 0.75 Torr is proper. If the exhaust pressure is about 7 Torr, a pressure difference of about 0.03 Torr is proper.

By setting the proper pressure difference in this way, it is possible to perform independent exhaust in the first exhaust port 610 and the second exhaust port 620 even if a communication space of 10 mm or more exists in the downside of the rotary table 2.

After the rotary table 2 is rotated by the number of revolutions required in forming a silicon oxide film having a desired thickness, the substrate processing method is completed by stopping the supply of the Si-containing gas, the $O_3$ gas and the mixed gas of the Ar gas, the $O_2$ gas and the $NH_3$ gas, which is supplied if necessary. Subsequently, the supply of the Ar gas or the $N_2$ gas from the separation gas nozzles 41 and 42, the separation gas supply pipe 51 and the purge gas supply pipes 72 and 73 is also stopped and the rotation of the rotary table 2 is stopped. Thereafter, the wafers W are unloaded from the interior of the vacuum container 1 in the order opposite to the order of loading the wafers W into the vacuum container 1.

As described above, according to the substrate processing method and the substrate processing apparatus of the first embodiment of the present disclosure, it is possible to prevent an oxidizing gas as a reaction gas from infiltrating into the first exhaust port 610 which is an exhaust port for a raw material gas.

Second Embodiment

Next, descriptions will be made on a substrate processing method and a substrate processing apparatus according to a second embodiment of the present disclosure.

Figure 19:
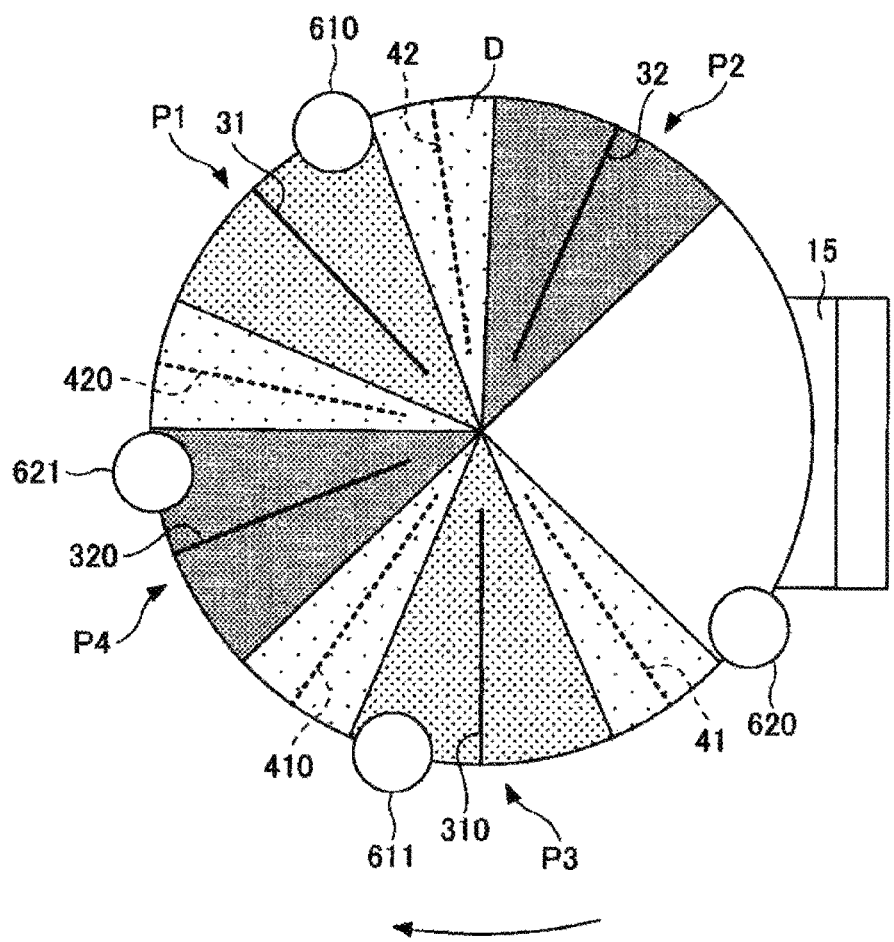
FIG. 19 is a view illustrating one example of a substrate processing apparatus according to a second embodiment of the present disclosure.

FIG. 19 is a view illustrating one example of the substrate processing apparatus according to the second embodiment of the present disclosure. The substrate processing apparatus according to the second embodiment differs from the substrate processing apparatus according to the first embodiment in that a third processing region P3 and a fourth processing region P4 are provided in addition to the first processing region P1 and the second processing region P2. Furthermore, the substrate processing apparatus according to the second embodiment differs from the substrate processing apparatus according to the first embodiment in that, with the addition of the third and fourth processing regions P3 and P4, a third exhaust port 611 and a fourth exhaust port 621 are provided in addition to the first exhaust port 610 and the second exhaust port 620.

Similar to the first processing region P1, the third processing region P3 is a region in which a raw material gas such as a silicon-containing gas or the like is supplied to the wafer W. Furthermore, similar to the second processing region P2, the fourth processing region P4 is a reaction gas supply region in which a reaction gas capable of reacting with the raw material gas and generating a reaction product is supplied to the wafer W. The third processing region P3 and the fourth processing region P4 are disposed in a mutually spaced-apart relationship along the rotational direction of the rotary table 2 from the upstream side. The third processing region P3 and the fourth processing region P4 have the same relationship as the relationship of the first processing region P1 and the second processing region P2. Separation regions D are defined between the first processing region P1 and the second processing region P2, between the second processing region P2 and the third processing region P3, between the third processing region P3 and the fourth processing region P4, and between the fourth processing region P4 and the first processing region P1.

As illustrated in FIG. 19, a third process gas nozzle 310 for supplying a raw material gas to the wafer W is installed in the third processing region P3, and a fourth process gas nozzle 320 for supplying a reaction gas to the wafer W is installed in the fourth processing region P4. In addition, separation gas nozzles 410 and 420 similar to the separation gas nozzles 41 and 42 are installed in the newly-added separation regions D.

With this configuration, the raw material gas adsorbed onto the wafer W in the first processing region P1 reacts with the reaction gas in the second processing region P2 to generate a reaction product. Thereafter, the raw material gas is adsorbed onto the wafer W (or the film formed by the reaction product) in the third processing region P3. The raw material gas reacts with the reaction gas in the fourth processing region P4 to generate a reaction product. Then, the process starting from the first processing region P1 is repeated. As described above, in the substrate processing apparatus according to the second embodiment, an atomic layer deposition (ALD) process is performed twice on the wafer W while the rotary table 2 makes one revolution. It is therefore possible to increase a substrate processing speed. For example, for a film forming process, it is possible to increase a deposition rate.

In order to form the four processing regions P1 to P4 along the circumferential direction of the rotary table 2, it is necessary to define the four processing regions P1 to P4 at an appropriate size (angle). For example, in the substrate processing apparatus according to the first embodiment, it is assumed that a transfer portion including the transfer port 15 is set at 72 degrees, the separation regions D are set at 60 degrees×2, the first processing region (raw material gas supply region) P1 is set at 60 degrees, and the second processing region P2 is set at 67.5 degrees. In the substrate processing apparatus according to the second embodiment, there is a need to narrow the respective regions. For example, the transfer portion including the transfer port 15 is set at 72 degrees as in the first embodiment. However, the separation regions D are set at 20 degrees×4, the first and third processing regions (raw material gas supply regions) P1 and P3 are set at 52 degrees×2, and the second and fourth processing regions (reaction gas supply regions) P2 and P4 are set at 52 degrees×2. In this way, the individual regions need to be set slightly narrow.

Since the first and third processing regions P1 and P3 are regions in which the raw material gas is supplied to the wafer W, the first processing region P1 may be referred to as a first raw material gas supply region P1 and the third processing region P3 may be referred to as a second raw material gas supply region P3. Similarly, since the second and fourth processing regions P2 and P4 are regions in which the reaction gas is supplied to the wafer W, the second processing region P2 may be referred to as a first reaction gas supply region P2 and the fourth processing region P4 may be referred to as a second reaction gas supply region P4. In the case where the reaction gas is supplied while performing a plasma process in the second and fourth processing regions P2 and P4, the second and fourth processing regions P2 and P4 may be referred to as first and second plasma processing regions P2 and P4.

The exhaust ports 610, 611, 620 and 621 are respectively installed in a corresponding relationship with the first and second raw material gas supply regions P1 and P3 and the first and second reaction gas supply regions P2 and P4. The raw material gas supplied in the first processing region P1 is exhausted from the first exhaust port 610. The reaction gas supplied in the second processing region P2 is exhausted from the second exhaust port 620. The raw material gas supplied in the third processing region P3 is exhausted from the third exhaust port 611. The reaction gas supplied in the fourth processing region P4 is exhausted from the exhaust port 621. In this respect, the substrate processing apparatus according to the second embodiment is the same as the substrate processing apparatus according to the first embodiment.

Even in the substrate processing apparatus according to the second embodiment, the rotary table 2 is configured to move up and down. When the wafer W is loaded into the vacuum container 1, the rotary table 2 is moved down. At a step of starting a substrate processing process after the warp of the wafer W is settled, the rotary table 2 makes upward movement. Accordingly, when performing the substrate processing process, a clearance is generated in the downside of the rotary table 2, whereby the first to fourth exhaust ports 610, 611, 620 and 621 communicate with one another. Thus, there may be generated a situation that, for example, the reaction gas to be exhausted from the second exhaust port 620 is infiltrated into the first exhaust port 610 from which the raw material gas is to be exhausted.

In the substrate processing method and the substrate processing apparatus according to the second embodiment, a substrate processing process which does not generate such infiltration is performed by regulating the exhaust pressures in the first to fourth exhaust ports 610, 611, 620 and 621. Hereinafter, the substrate processing method and the substrate processing apparatus according to the second embodiment will be described using the results of simulation tests.

FIGS. 20A to 20E are views illustrating the results of a first simulation test of the substrate processing method according to the second embodiment of the present disclosure. In the first simulation test, the exhaust pressures in the first to fourth exhaust ports 610, 611, 620 and 621 were set at 2 Torr. As other process conditions, the temperature of the wafer W was set at 400 degrees C. and the rotational speed of the rotary table 2 was set at 20 rpm. A process of forming a SiN film was implemented by using DCS (dichlorosilane, $Si_2Cl_2$) as the raw material gas and using $NH_3$ as the reaction gas. A process of performing a plasma process was implemented in the second and fourth processing regions P2 and P4. An Ar gas was supplied at a flow rate of 3 slm from the separation gas supply pipe 51 disposed above the rotary shaft 22. An Ar gas was supplied at a flow rate of 5 slm×4 from the separation gas nozzles 41 and 42 (four separation gas nozzles installed in all of the separation regions D). In addition, the flow rate of DCS as the raw material gas was set at 0.5 slm×2 and the flow rate of $NH_3$ as the reaction gas was set at 5 slm×2.

Figure 20A:
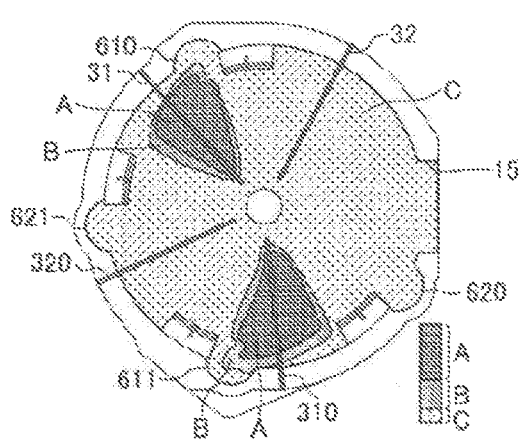
FIGS. 20A to 20E are views illustrating results of a first simulation test of a substrate processing method according to the second embodiment of the present disclosure.

FIG. 20A is a view illustrating the simulation result of a DCS concentration distribution in the upside of the rotary table 2. As in the first embodiment, the highest concentration level is indicated by level A, a moderate concentration level is indicated by level B, and the lowest negligible concentration level is indicated by level C. Furthermore, the arrangement of the processing regions P1 to P4 within the vacuum container 1 is the same as the arrangement illustrated in FIG. 19. This holds true in the following simulation results. This description will not be repeated herein below.

As illustrated in FIG. 20A, the ranges of concentration levels A and B of DCS as the raw material gas fall within the first and third processing regions P1 and P3 above the rotary table 2. It is shown that the separation of the raw material gas is appropriately performed.

Figure 20B:
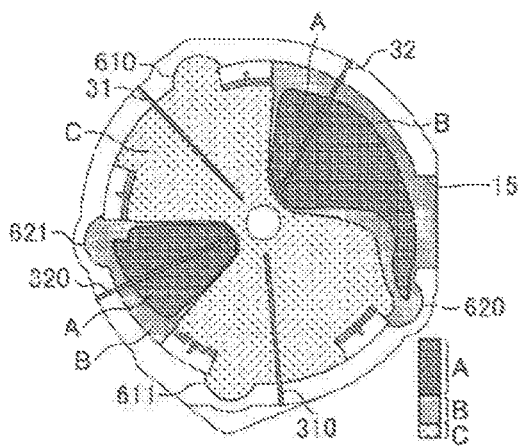

FIG. 20B is a view illustrating the simulation result of an $NH_3$ plasma concentration distribution in the upside of the rotary table 2. As illustrated in FIG. 20B, the ranges of concentration levels A and B fall within the second and fourth processing regions P2 and P4. It is shown that the separation of the reaction gas is appropriately performed in the upside of the rotary table 2.

Figure 20C:
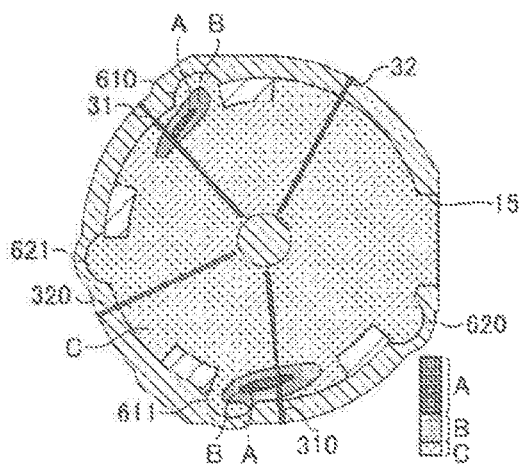

FIG. 20C is a view illustrating the simulation result of a DCS concentration distribution in the downside of the rotary table 2. As illustrated in FIG. 20C, the ranges of concentration levels A and B of DCS fall within the first and third processing regions P1 and P3. It is shown that the separation of the raw material gas is appropriately performed even in the downside of the rotary table 2.

Figure 20D:
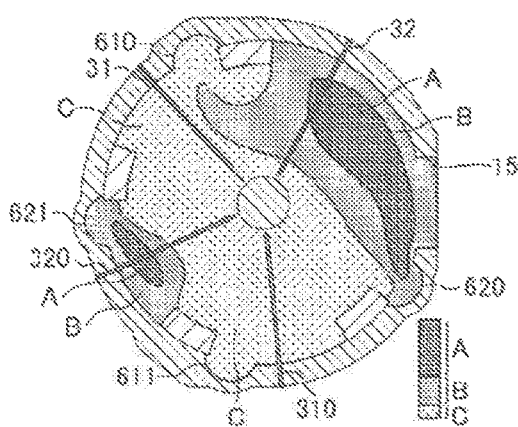

FIG. 20D is a view illustrating the simulation result of an $NH_3$ plasma concentration distribution in the downside of the rotary table 2. As illustrated in FIG. 20D, the range of concentration level B reaches the vicinity of the first exhaust port 610 of the first processing region P1. This indicates that the influence of the reaction gas reaches the first exhaust port 610 of the raw material gas supply region P1. It can be noted that the separation of the reaction gas is not sufficiently performed and the infiltration of the reaction gas is generated.

Figure 20E:
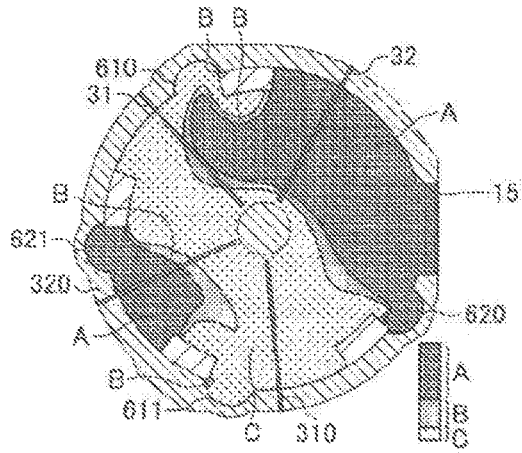

FIG. 20E is a view illustrating the simulation result of an $NH_3$ plasma concentration distribution in the downside of the rotary table 2 when an $NH_3$ plasma concentration is set at 10% of a maximum value. As illustrated in FIG. 20E, the range of concentration level A reaches the first exhaust port 610 of the first processing region P1. The infiltration of the reaction gas into the first exhaust port 610 is clearly shown.

As described above, if the exhaust pressures in the first to fourth exhaust ports 610, 611, 620 and 621 are equally set at 2 Torr, the infiltration of the reaction gas into the first exhaust port 610 is generated in the downside of the rotary table 2. It is shown that this substrate processing method is not employable.

FIGS. 21A to 21E are views illustrating the results of a second simulation test of the substrate processing method according to the second embodiment of the present disclosure. In the second simulation test, the exhaust pressure in the first exhaust port 610 was set at 2.027 Torr and the exhaust pressures in the second to fourth exhaust ports 611, 620 and 621 were set at 2 Torr. Other conditions are the same as those of the first simulation test.

Figure 21A:
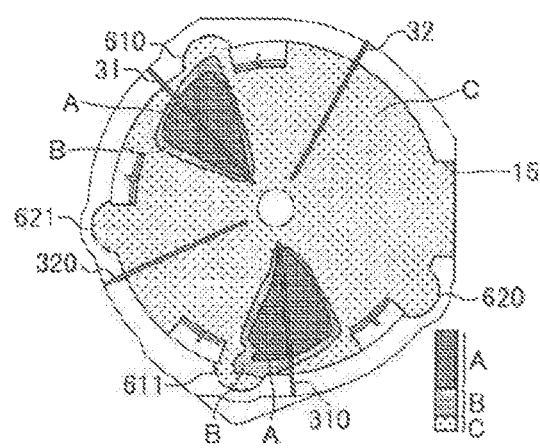
FIGS. 21A to 21E are views illustrating results of a second simulation test of a substrate processing method according to the second embodiment of the present disclosure.

FIG. 21A is a view illustrating the simulation result of a DCS concentration distribution in the upside of the rotary table 2. As illustrated in FIG. 21A, the ranges of concentration levels A and B of DCS as the raw material gas fall within the first and third processing regions P1 and P3 in the upside of the rotary table 2. It is shown that the separation of the raw material gas is appropriately performed.

Figure 21B:
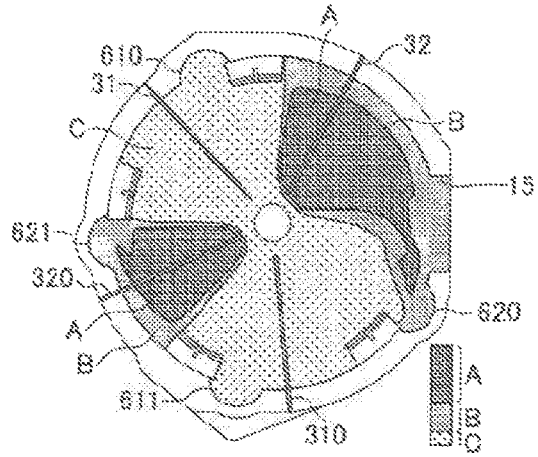

FIG. 21B is a view illustrating the simulation result of an $NH_3$ plasma concentration distribution in the upside of the rotary table 2. As illustrated in FIG. 21B, the ranges of concentration levels A and B fall within the second and fourth processing regions P2 and P4. It is shown that the separation of the reaction gas is appropriately performed in the upside of the rotary table 2.

Figure 21C:
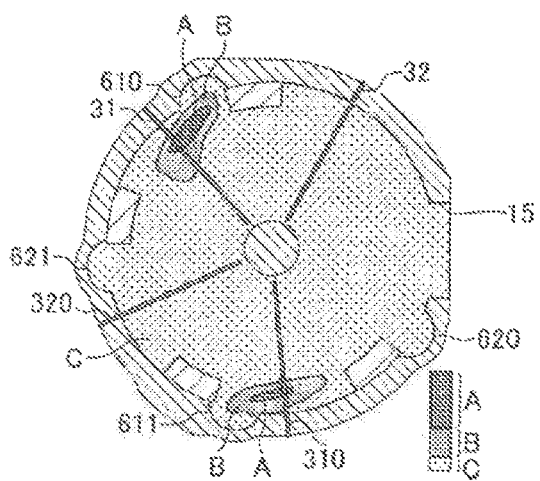

FIG. 21C is a view illustrating the simulation result of a DCS concentration distribution in the downside of the rotary table 2. As illustrated in FIG. 21C, the ranges of concentration levels A and B of DCS fall within the first and third processing regions P1 and P3. It is shown that the separation of the raw material gas is appropriately performed even in the downside of the rotary table 2.

Figure 21D:
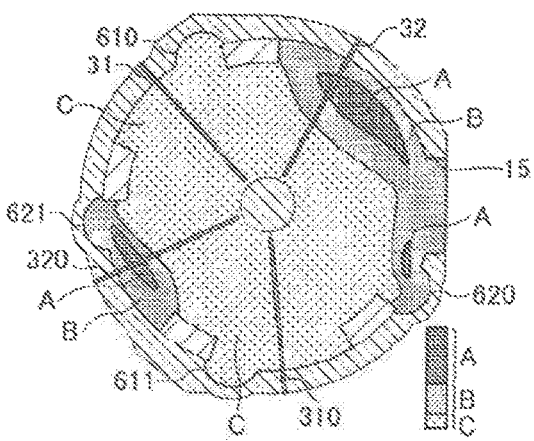

FIG. 21D is a view illustrating the simulation result of an $NH_3$ plasma concentration distribution in the downside of the rotary table 2. As illustrated in FIG. 21D, the range of concentration level B falls within the second and fourth processing regions P2 and P4. The reaction gas existing in the second processing region P2 did not reach the first exhaust port 610 of the first processing region P1. This indicates that the separation of the reaction gas is appropriately performed even in the downside of the rotary table 2.

Figure 21E:
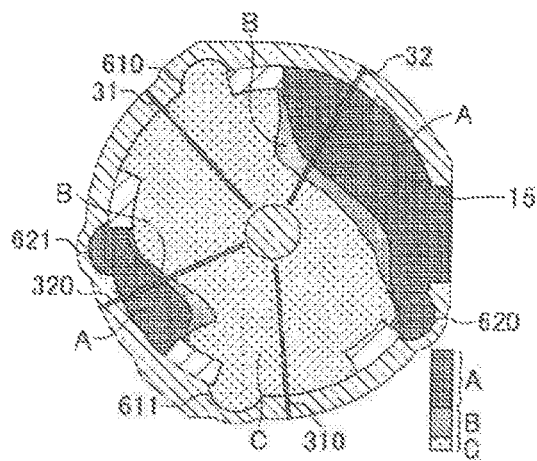

FIG. 21E is a view illustrating the simulation result of an $NH_3$ plasma concentration distribution in the downside of the rotary table 2 when an $NH_3$ plasma concentration is set at 10% of a maximum value. As illustrated in FIG. 21E, even when the plasma concentration is set at 10% of the maximum value, the ranges of concentration levels A and B in the second processing region P2 do not reach the first exhaust port 610 of the first processing region P1. As described above, it is shown that if the exhaust pressure in the first exhaust port 610, one of the conditions of the second simulation test, is set a little higher than the exhaust pressures in the second to fourth exhaust ports 611, 620 and 621, it is possible to reliably prevent the infiltration of the reaction gas into the first exhaust port 610.

FIGS. 22A to 22E are views illustrating the results of a third simulation test of the substrate processing method according to the second embodiment of the present disclosure. In the third simulation test, the exhaust pressures in the first to fourth exhaust ports 610, 611, 620 and 621 were set at 4 Torr. Furthermore, the internal pressure of the vacuum container 1 was set at 4 Torr. Conditions other than the exhaust pressures in the exhaust ports and the internal pressure of the vacuum container 1 are the same as those of the first and second simulation tests.

Figure 22A:
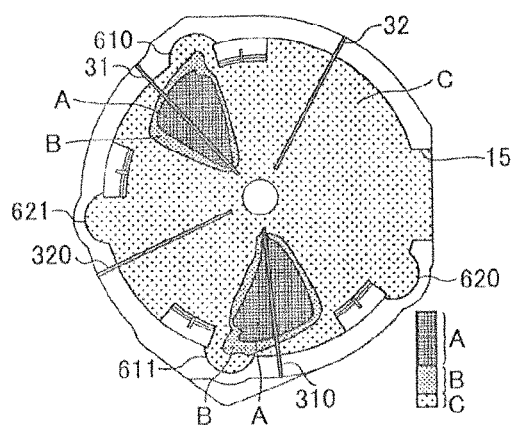
FIGS. 22A to 22E are views illustrating results of a third simulation test of a substrate processing method according to the second embodiment of the present disclosure.

FIG. 22A is a view illustrating the simulation result of a DCS concentration distribution in the upside of the rotary table 2. As illustrated in FIG. 22A, the ranges of concentration levels A and B of DCS as the raw material gas fall within the first and third processing regions P1 and P3 in the upside of the rotary table 2. It is shown that the separation of the raw material gas is appropriately performed.

Figure 22B:
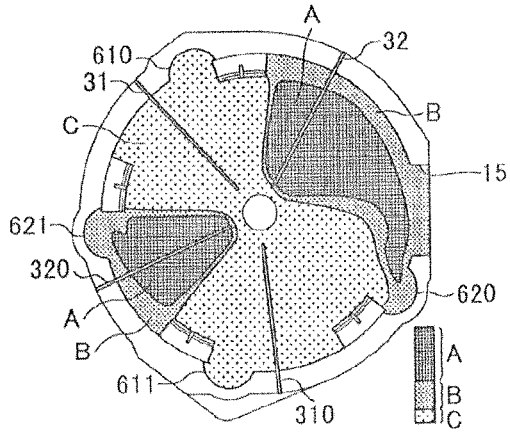

FIG. 22B is a view illustrating the simulation result of an $NH_3$ plasma concentration distribution in the upside of the rotary table 2. As illustrated in FIG. 22B, the ranges of concentration levels A and B fall within the second and fourth processing regions P2 and P4. It is shown that the separation of the reaction gas is appropriately performed in the upside of the rotary table 2.

Figure 22C:
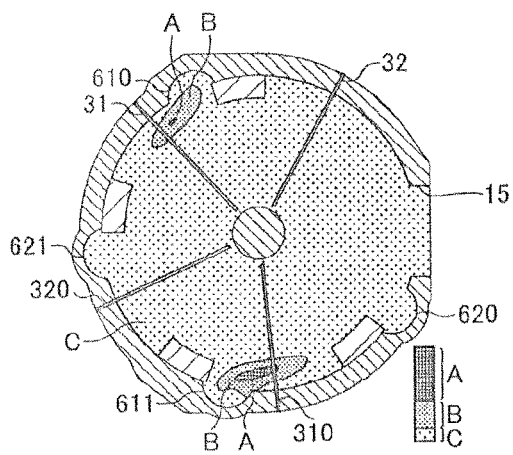

FIG. 22C is a view illustrating the simulation result of a DCS concentration distribution in the downside of the rotary table 2. As illustrated in FIG. 22C, the ranges of concentration levels A and B of DCS fall within the first and third processing regions P1 and P3. It is shown that the separation of the raw material gas is appropriately performed even in the downside of the rotary table 2.

Figure 22D:
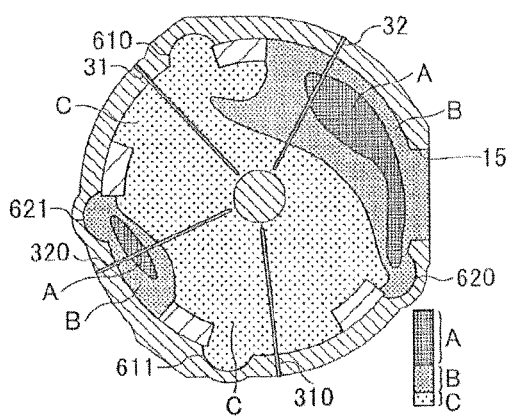

FIG. 22D is a view illustrating the simulation result of an $NH_3$ plasma concentration distribution in the downside of the rotary table 2. As illustrated in FIG. 22D, the range of concentration level B reaches the vicinity of the first exhaust port 610 of the first processing region P1. This indicates that the influence of the reaction gas reaches the vicinity of the first exhaust port 610 of the first processing region P1. It can be noted that the separation of the reaction gas is not sufficiently performed and the infiltration of the reaction gas is likely to occur.

Figure 22E:
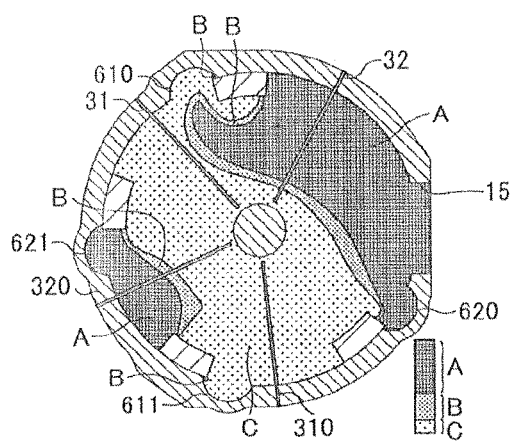

FIG. 22E is a view illustrating the simulation result of an $NH_3$ plasma concentration distribution in the downside of the rotary table 2 when an $NH_3$ plasma concentration is set at 10% of a maximum value. As illustrated in FIG. 22E, the range of concentration level A reaches the first exhaust port 610 of the first processing region P1. The infiltration of the reaction gas into the first exhaust port 610 is shown.

As described above, in the case where the exhaust pressures in the first to fourth exhaust ports 610, 611, 620 and 621 are equally set at 4 Torr, if the plasma concentration is maximized, the infiltration of the reaction gas into the first exhaust port 610 is generated in the downside of the rotary table 2. It can be noted that this substrate processing method is not employable.

FIGS. 23A to 23E are views illustrating the results of a fourth simulation test of the substrate processing method according to the second embodiment of the present disclosure. In the fourth simulation test, the exhaust pressure in the first exhaust port 610 was set at 4.01 Torr and the exhaust pressures in the second to fourth exhaust ports 611, 620 and 621 were set at 4 Torr. Conditions other than the exhaust pressures in the exhaust ports are the same as those of the third simulation test.

Figure 23A:
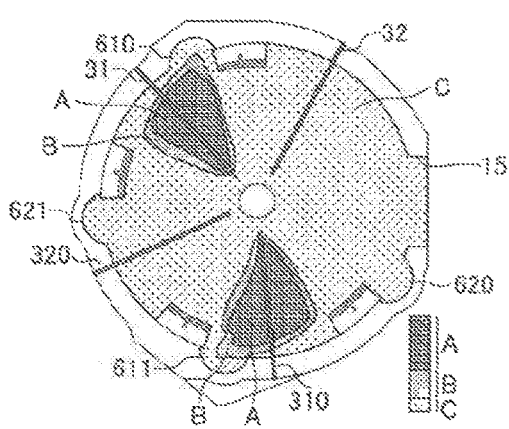
FIGS. 23A to 23E are views illustrating results of a fourth simulation test of a substrate processing method according to the second embodiment of the present disclosure.

FIG. 23A is a view illustrating the simulation result of a DCS concentration distribution in the upside of the rotary table 2. As illustrated in FIG. 23A, the ranges of concentration levels A and B of DCS as the raw material gas fall within the first and third processing regions P1 and P3 in the upside of the rotary table 2. It is shown that the separation of the raw material gas is appropriately performed.

Figure 23B:
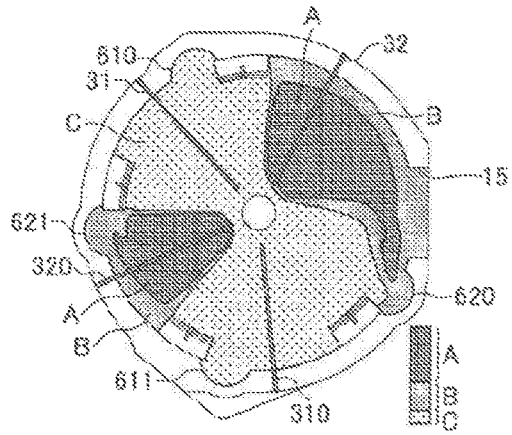

FIG. 23B is a view illustrating the simulation result of an $NH_3$ plasma concentration distribution in the upside of the rotary table 2. As illustrated in FIG. 23B, the ranges of concentration levels A and B fall within the second and fourth processing regions P2 and P4. It is shown that the separation of the reaction gas is appropriately performed in the upside of the rotary table 2.

Figure 23C:
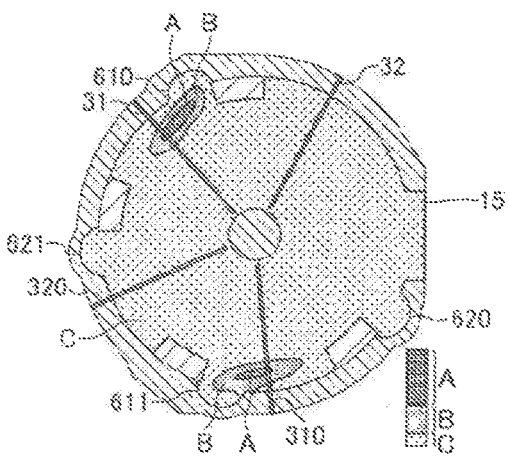

FIG. 23C is a view illustrating the simulation result of a DCS concentration distribution in the downside of the rotary table 2. As illustrated in FIG. 23C, the ranges of concentration levels A and B of DCS fall within the first and third processing regions P1 and P3. It is shown that the separation of the raw material gas is appropriately performed even in the downside of the rotary table 2.

Figure 23D:
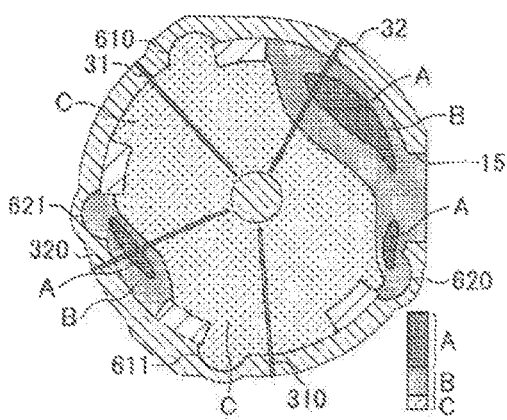

FIG. 23D is a view illustrating the simulation result of an $NH_3$ plasma concentration distribution in the downside of the rotary table 2. As illustrated in FIG. 23D, the ranges of concentration levels A and B fall within the second and fourth processing regions P2 and P4. The reaction gas existing in the second processing region P2 does not reach the first exhaust port 610 of the first processing region P1. This indicates that the separation of the reaction gas is appropriately performed even in the downside of the rotary table 2.

Figure 23E:
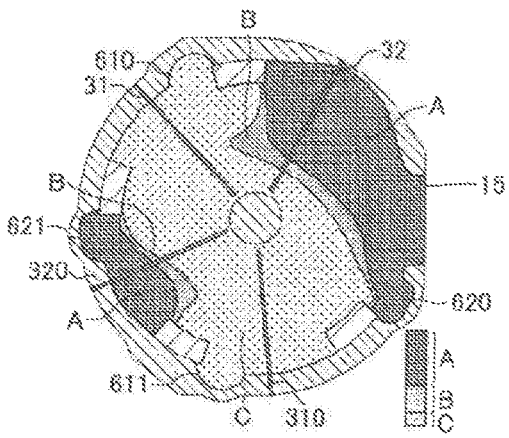

FIG. 23E is a view illustrating the simulation result of an $NH_3$ plasma concentration distribution in the downside of the rotary table 2 when an $NH_3$ plasma concentration is set at 10% of a maximum value. As illustrated in FIG. 23E, even when the plasma concentration is set at 10% of the maximum value, the ranges of concentration levels A and B in the second processing region P2 do not reach the first exhaust port 610 of the first processing region P1. As described above, it is shown that if the exhaust pressure in the first exhaust port 610, one of the conditions of the fourth simulation test, is set a little higher than the exhaust pressures in the second to fourth exhaust ports 611, 620 and 621, it is possible to reliably prevent the infiltration of the reaction gas into the first exhaust port 610.

FIGS. 24A to 24E are views illustrating the results of a fifth simulation test of the substrate processing method according to the second embodiment of the present disclosure. In the fifth simulation test, the exhaust pressure in the first exhaust port 610 was set at 4.015 Torr and the exhaust pressures in the second to fourth exhaust ports 611, 620 and 621 were set at 4 Torr. Conditions other than the exhaust pressure in the first exhaust port 610 are the same as those of the fourth simulation test.

Figure 24A:
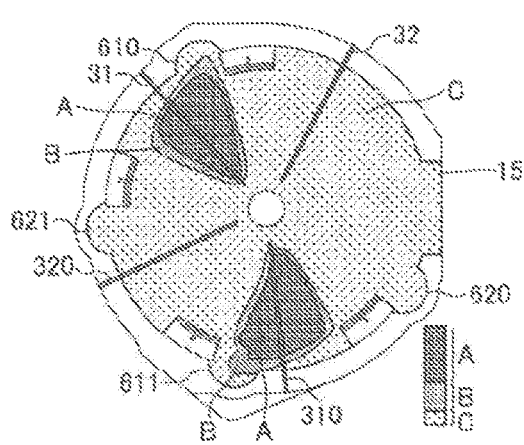
FIGS. 24A to 24E are views illustrating results of a fifth simulation test of a substrate processing method according to the second embodiment of the present disclosure.

FIG. 24A is a view illustrating the simulation result of a DCS concentration distribution in the upside of the rotary table 2. As illustrated in FIG. 24A, the ranges of concentration levels A and B of DCS as the raw material gas fall within the first and third processing regions P1 and P3 in the upside of the rotary table 2. It is shown that the separation of the raw material gas is appropriately performed.

Figure 24B:
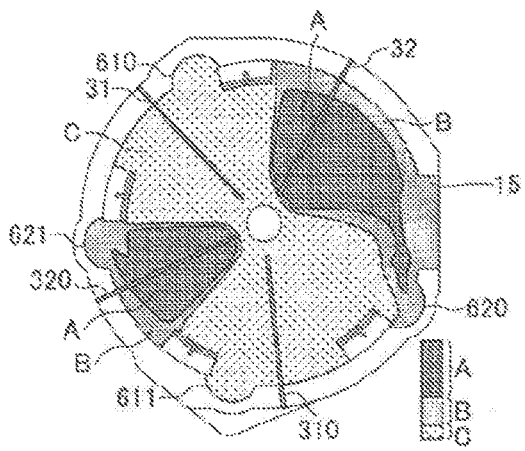

FIG. 24B is a view illustrating the simulation result of an $NH_3$ plasma concentration distribution in the upside of the rotary table 2. As illustrated in FIG. 24B, the ranges of concentration levels A and B fall within the second and fourth processing regions P2 and P4. It is shown that the separation of the reaction gas is appropriately performed in the upside of the rotary table 2.

Figure 24C:
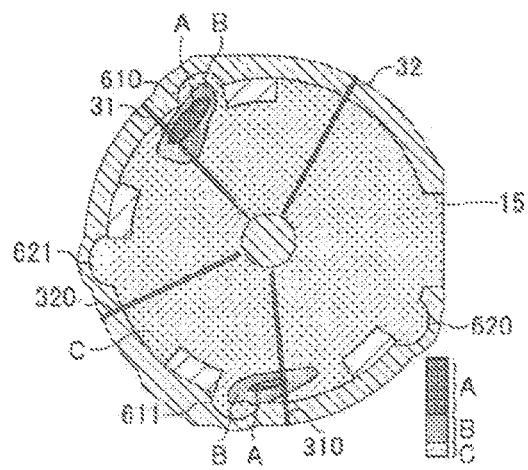

FIG. 24C is a view illustrating the simulation result of a DCS concentration distribution in the downside of the rotary table 2. As illustrated in FIG. 24C, the ranges of concentration levels A and B of DCS fall within the first and third processing regions P1 and P3. It is shown that the separation of the raw material gas is appropriately performed even in the downside of the rotary table 2.

Figure 24D:
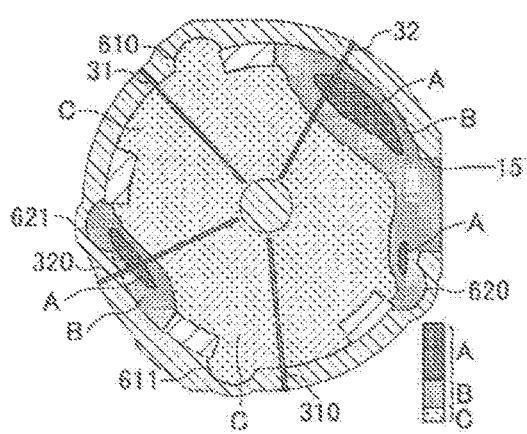

FIG. 24D is a view illustrating the simulation result of an $NH_3$ plasma concentration distribution in the downside of the rotary table 2. As illustrated in FIG. 24D, the ranges of concentration levels A and B fall within the second and fourth processing regions P2 and P4. The reaction gas existing in the second processing region P2 does not reach the first exhaust port 610 of the first processing region P1. This indicates that the separation of the reaction gas is appropriately performed even in the downside of the rotary table 2.

Figure 24E:
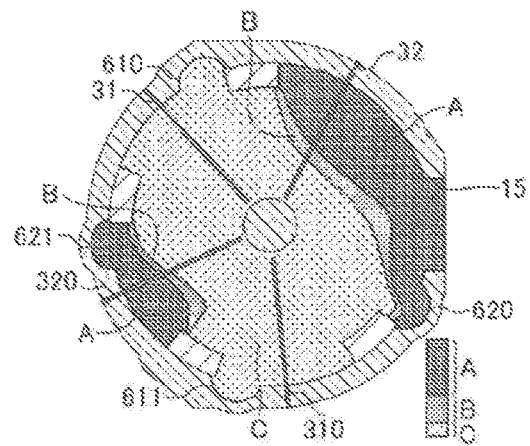

FIG. 24E is a view illustrating the simulation result of an $NH_3$ plasma concentration distribution in the downside of the rotary table 2 when an $NH_3$ plasma concentration is set at 10% of a maximum value. As illustrated in FIG. 24E, even when the plasma concentration is set at 10% of the maximum value, the ranges of concentration levels A and B in the second processing region P2 do not reach the first exhaust port 610 of the first processing region P1. Moreover, the expansion of the ranges of concentration levels A and B is smaller than that of the results of the fourth simulation test. The ranges of concentration levels A and B are farther from the first exhaust port 610. Accordingly, it is shown that in the fifth simulation test, namely when the exhaust pressure in the first exhaust port 610 is set at 4.015 Torr which is a little (0.005 Torr) higher than 4.01 Torr, it is possible to reliably prevent the infiltration of the reaction gas into the first exhaust port 610. By slightly changing the exhaust pressure in the first exhaust port 610 in this way, it is possible to find the optimum conditions for preventing the infiltration of the reaction gas into the first exhaust port 610.

FIGS. 25A to 25E are views illustrating the results of a sixth simulation test of the substrate processing method according to the second embodiment of the present disclosure. In the sixth simulation test, the exhaust pressures in the first to fourth exhaust ports 610, 611, 620 and 621 were set at 6 Torr. Furthermore, the internal pressure of the vacuum container 1 was set at 6 Torr. Conditions other than the exhaust pressures in the exhaust ports and the internal pressure of the vacuum container 1 are the same as those of the first to fifth simulation tests.

Figure 25A:
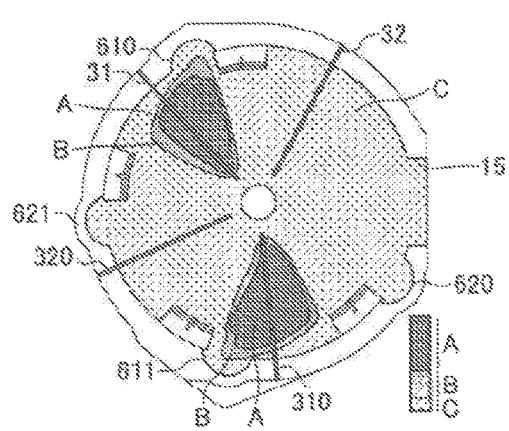
FIGS. 25A to 25E are views illustrating results of a sixth simulation test of a substrate processing method according to the second embodiment of the present disclosure.

FIG. 25A is a view illustrating the simulation result of a DCS concentration distribution in the upside of the rotary table 2. As illustrated in FIG. 25A, the ranges of concentration levels A and B of DCS as the raw material gas fall within the first and third processing regions P1 and P3 in the upside of the rotary table 2. It is shown that the separation of the raw material gas is appropriately performed.

Figure 25B:
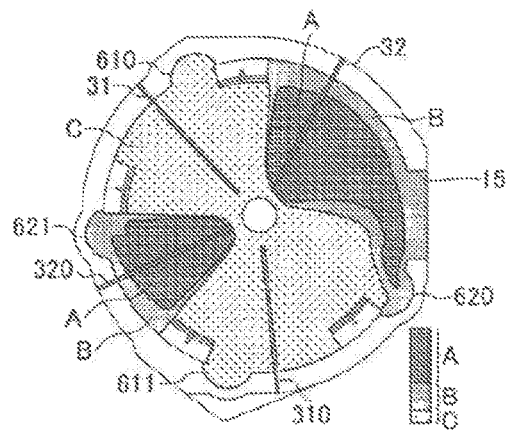

FIG. 25B is a view illustrating the simulation result of an $NH_3$ plasma concentration distribution in the upside of the rotary table 2. As illustrated in FIG. 25B, the ranges of concentration levels A and B fall within the second and fourth processing regions P2 and P4. It is shown that the separation of the reaction gas is appropriately performed in the upside of the rotary table 2.

Figure 25C:
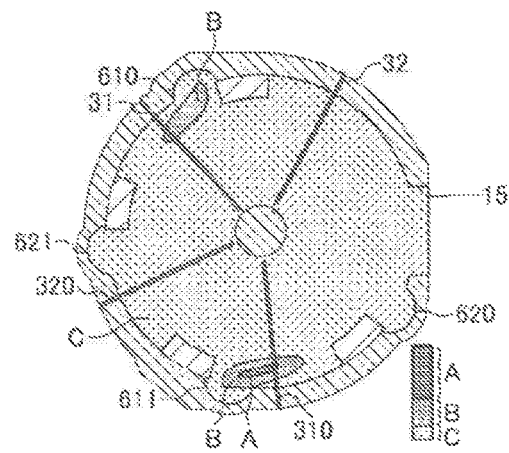

FIG. 25C is a view illustrating the simulation result of a DCS concentration distribution in the downside of the rotary table 2. As illustrated in FIG. 25C, the ranges of concentration levels A and B of DCS fall within the first and third processing regions P1 and P3. It is shown that the separation of the raw material gas is appropriately performed even in the downside of the rotary table 2.

Figure 25D:
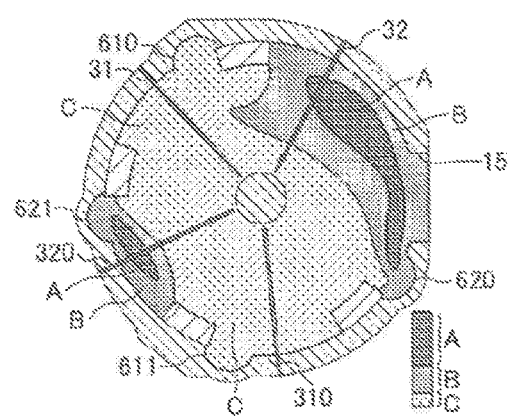

FIG. 25D is a view illustrating the simulation result of an $NH_3$ plasma concentration distribution in the downside of the rotary table 2. As illustrated in FIG. 25D, the range of concentration level B extends toward the first exhaust port 610 of the first processing region P1 but does not reach the vicinity of the first exhaust port 610. It is shown that the separation of the reaction gas is performed to an acceptable level even in the downside of the rotary table 2.

Figure 25E:
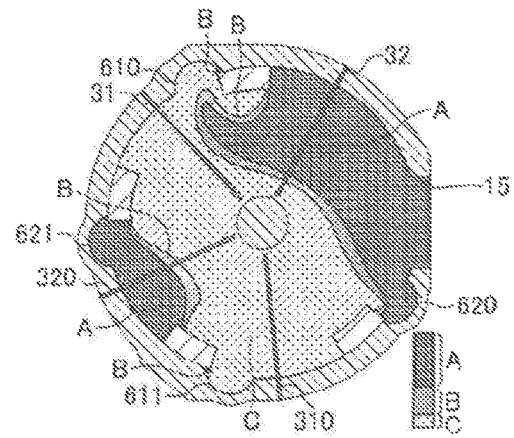

FIG. 25E is a view illustrating the simulation result of an $NH_3$ plasma concentration distribution in the downside of the rotary table 2 when an $NH_3$ plasma concentration is set at 10% of a maximum value. As illustrated in FIG. 25E, the range of concentration level B reaches the first exhaust port 610 of the first processing region P1. The infiltration of the reaction gas into the first exhaust port 610 is shown.

As described above, in the case where the exhaust pressures in the first to fourth exhaust ports 610, 611, 620 and 621 are equally set at 6 Torr, if the plasma concentration is maximized, the infiltration of the reaction gas into the first exhaust port 610 is generated in the downside of the rotary table 2. It can be noted that this substrate processing method is not employable.

FIGS. 26A to 26E are views illustrating the results of a seventh simulation test of the substrate processing method according to the second embodiment of the present disclosure. In the seventh simulation test, the exhaust pressure in the first exhaust port 610 was set at 6.01 Torr and the exhaust pressures in the second to fourth exhaust ports 611, 620 and 621 were set at 6 Torr. Conditions other than the exhaust pressure in the first exhaust port 610 are the same as those of the sixth simulation test.

Figure 26A:
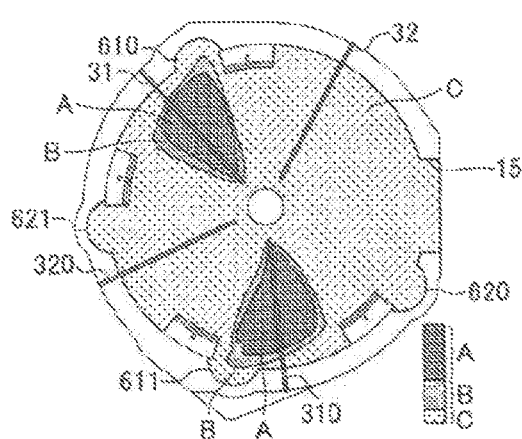
FIGS. 26A to 26E are views illustrating results of a seventh simulation test of a substrate processing method according to the second embodiment of the present disclosure.

FIG. 26A is a view illustrating the simulation result of a DCS concentration distribution in the upside of the rotary table 2. As illustrated in FIG. 26A, the ranges of concentration levels A and B of DCS as the raw material gas fall within the first and third processing regions P1 and P3 in the upside of the rotary table 2. It is shown that the separation of the raw material gas is appropriately performed.

Figure 26B:
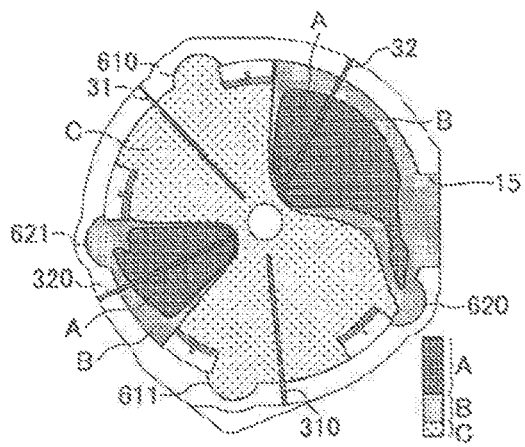

FIG. 26B is a view illustrating the simulation result of an $NH_3$ plasma concentration distribution in the upside of the rotary table 2. As illustrated in FIG. 26B, the ranges of concentration levels A and B fall within the second and fourth processing regions P2 and P4. It is shown that the separation of the reaction gas is appropriately performed in the upside of the rotary table 2.

Figure 26C:
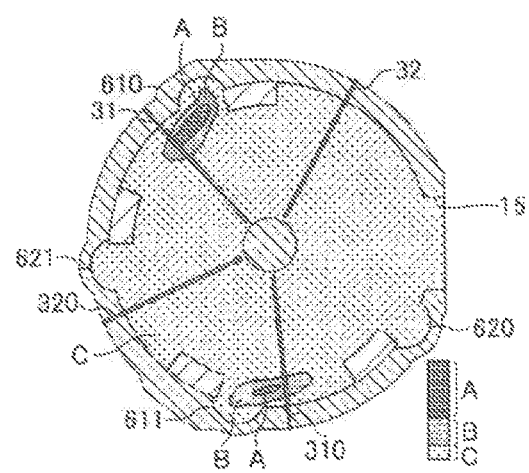

FIG. 26C is a view illustrating the simulation result of a DCS concentration distribution in the downside of the rotary table 2. As illustrated in FIG. 26C, the ranges of concentration levels A and B of DCS fall within the first and third processing regions P1 and P3. It is shown that the separation of the raw material gas is appropriately performed even in the downside of the rotary table 2.

Figure 26D:
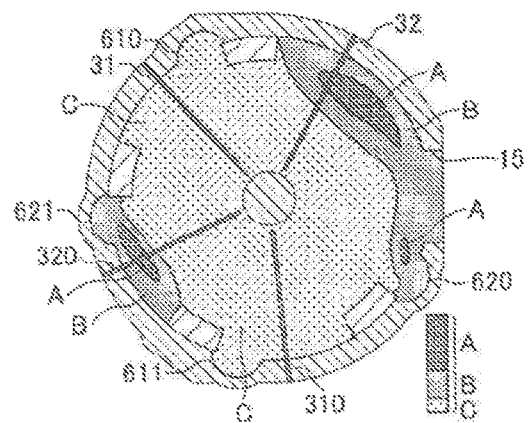

FIG. 26D is a view illustrating the simulation result of an NH$_3$ plasma concentration distribution in the downside of the rotary table 2. As illustrated in FIG. 26D, the ranges of concentration levels A and B fall within the second and fourth processing regions P2 and P4. The reaction gas existing in the second processing region P2 does not reach the first exhaust port 610 of the first processing region P1. This indicates that the separation of the reaction gas is appropriately performed even in the downside of the rotary table 2.

Figure 26E:
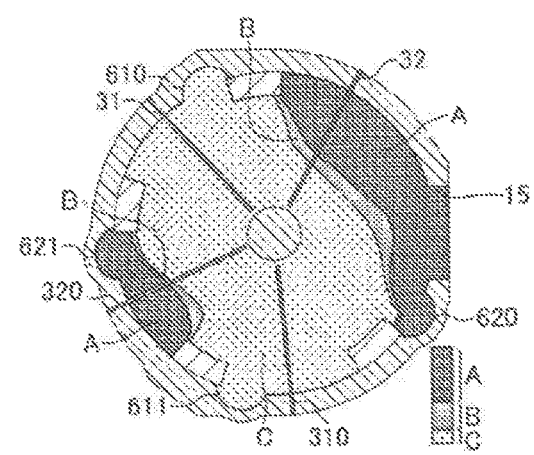

FIG. 26E is a view illustrating the simulation result of an NH$_3$ plasma concentration distribution in the downside of the rotary table 2 when an NH$_3$ plasma concentration is set at 10% of a maximum value. As illustrated in FIG. 26E, even when the plasma concentration is set at 10% of the maximum value, the ranges of concentration levels A and B in the second processing region P2 do not reach the first exhaust port 610 of the first processing region P1. Moreover, the expansion of the ranges of concentration levels A and B is as small as that of the results of the fifth simulation test. The ranges of concentration levels A and B are farther from the first exhaust port 610. It is shown that if the exhaust pressure in the first exhaust port 610, one of the conditions of the seventh simulation test, is set a little higher than the exhaust pressures in the second to fourth exhaust ports 611, 620 and 621 in this way, it is possible to reliably prevent the infiltration of the reaction gas into the first exhaust port 610.

In some embodiments, the internal pressure of the vacuum container 1 and the exhaust pressure in the first exhaust port 610 adjoining the second processing region P2 may be set as follows.

In the case where the internal pressure of the vacuum container 1 is 1 to 3 Torr, the exhaust pressure in the first exhaust port 610 corresponding to the first processing region P1 may be set at 0.015 to 0.06 Torr higher than the exhaust pressures in the remaining second to fourth exhaust ports 611, 620 and 621. Alternatively, ballast may be allowed to flow so that the exhaust pressure in the first exhaust port 610 becomes equal to the exhaust pressures in the remaining second to fourth exhaust ports 611, 620 and 621.

In the case where the internal pressure of the vacuum container 1 is 3 to 5 Torr, the exhaust pressure in the first exhaust port 610 corresponding to the first processing region P1 may be set at 0.01 to 0.03 Torr higher than the exhaust pressures in the remaining second to fourth exhaust ports 611, 620 and 621. Alternatively, ballast may be allowed to flow so that the exhaust pressure in the first exhaust port 610 becomes equal to the exhaust pressures in the remaining second to fourth exhaust ports 611, 620 and 621.

In the case where the internal pressure of the vacuum container 1 is 5 to 10 Torr, the exhaust pressure in the first exhaust port 610 corresponding to the first processing region P1 may be set at 0.005 to 0.015 Torr higher than the exhaust pressures in the remaining second to fourth exhaust ports 611, 620 and 621. Alternatively, ballast may be allowed to flow so that the exhaust pressure in the first exhaust port 610 becomes equal to the exhaust pressures in the remaining second to fourth exhaust ports 611, 620 and 621.

Such conditions are consistent with the results of the first to seventh simulation tests.

As described above, even when the number of the processing regions P1 to P4 is increased to four, it is possible to prevent the infiltration of the reaction gas into the first exhaust port 610 by setting the exhaust pressure in the first exhaust port 610 a little higher than the exhaust pressures in the remaining second to fourth exhaust ports 611, 620 and 621. Furthermore, the third processing region P3 and the first processing region P1 are relatively narrow and the third and fourth exhaust ports 611 and 621 are spaced apart from the exhaust ports of the remaining processing regions P1 and P2. Thus, the exhaust ports 611 and 621 existing within the processing regions P3 and P4 become the closest exhaust ports 611 and 612 in the processing regions P3 and P4. In this case, no particular problem arises. Therefore, it is not necessary to perform complex setting by which the exhaust pressures in the third and fourth exhaust ports 611 and 621 are changed. It is sufficient to perform pressure difference control with respect to only the first exhaust port 610 to which the second process gas nozzle 32 is closer than the second exhaust port 620.

In the second embodiment, there has been described an example in which the number of the processing regions is increased to four. Even when the number of the processing regions is further increased to six or eight, if the aforementioned pressure difference control is applied to only the location closer to the exhaust port of the adjoining processing region than the exhaust port existing within the processing region, it is possible to sufficiently prevent the infiltration of the reaction gas into the exhaust ports of the remaining processing regions.

In the aforementioned embodiments, there has been described an example in which the silicon-containing gas is used as the raw material gas and the oxidizing gas is used as the reaction gas. However, it may be possible to use many different combinations of the raw material gas and the reaction gas. As an example, a silicon nitride film may be formed by using a silicon-containing gas as the raw material gas and using a nitriding gas such as ammonia or the like as the reaction gas. In some embodiments, a titanium nitride film may be formed by using a titanium-containing gas as the raw material gas and using a nitriding gas as the reaction gas. As described above, the raw material gas may be selected from various gases such as an organic metal gas and the like. As the reaction gas, it may be possible to use various reaction gases such as an oxidizing gas, a nitriding gas and the like capable of reacting with a raw material gas and generating a reaction product.

Furthermore, in the aforementioned embodiments, there has been described an example in which the film forming process is performed as the substrate process. However, the present disclosure may be applied to a substrate processing apparatus other than a film forming apparatus as long as the substrate processing apparatus is provided with a plurality of exhaust ports and is capable of independently exhausting processing gases in a corresponding relationship with individual processing regions.

According to the present disclosure in some embodiments, it is possible to independently exhaust gases from a plurality of exhaust ports even when a communication space exists under a rotary table.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method using a processing chamber that is provided with a rotary table, a first process gas supply region above the rotary table, a first exhaust port formed in a bottom portion of the first process gas supply region and through which a first process gas supplied to the first process gas supply region is exhausted, a second process gas supply region above the rotary table, a second exhaust port formed in a bottom portion of the second process gas supply region and through which a second process gas supplied to the second process gas supply region is exhausted, and a communication space formed below the rotary table and common to the first process gas and the second process gas and through which the first exhaust port and the second exhaust port communicate with each other, wherein an exhaust pressure in the first exhaust port is set higher than an exhaust pressure in the second exhaust port by a predetermined pressure during a substrate process so that both of the first process gas and the second process gas flow into the communication space while exhausting the first process gas through the first exhaust port and the second process gas through the second exhaust port thereby preventing infiltration of the second process gas into the first exhaust port.

2. The method of claim 1, wherein the predetermined pressure falls within a predetermined pressure range.

3. The method of claim 2, wherein the predetermined pressure range is a pressure range in which infiltration of the first process gas into the second exhaust port is not generated.

4. The method of claim 2, wherein the communication space is a space defined under the rotary table configured to mount a substrate on an upper surface thereof, the first process gas supply region and the second process gas supply region are separated from each other above the rotary table by a separation region protruding downward from a ceiling surface of the processing chamber and are configured so that infiltration of the second process gas into the first process gas supply region and infiltration of the first process gas into the second process gas supply region are not generated, and the substrate process is performed by rotating the rotary table while carrying out the exhaust of the first process gas and the second process gas from the first exhaust port and the second exhaust port, the supply of the first process gas to the first process gas supply region and the supply of the second process gas to the second process gas supply region.

5. The method of claim 4, wherein a purge gas is supplied from the separation region, the purge gas in addition to the first process gas is exhausted from the first exhaust port, and the purge gas in addition to the second process gas is exhausted from the second exhaust port.

6. The method of claim 4, wherein the first exhaust port is formed at a downstream end of the first process gas supply region in a rotational direction of the rotary table, the second exhaust port is formed at a downstream end of the second process gas supply region in the rotational direction of the rotary table, the second process gas supply region is longer than the first process gas supply region in the rotational direction of the rotary table, and a second process gas supply nozzle configured to supply the second process gas to the second process gas supply region is installed closer to the first exhaust port than the second exhaust port.

7. The method of claim 6, wherein the substrate process is an atomic layer deposition (ALD) film forming process.

8. The method of claim 7, wherein the first process gas is a raw material gas, and the second process gas is a reaction gas capable of reacting with the raw material gas to generate a reaction product.

9. The method of claim 8, wherein the predetermined pressure range varies depending on an internal pressure of the processing chamber.

10. The method of claim 9, wherein the predetermined pressure range is set to become smaller as the internal pressure of the processing chamber grows higher.

11. The method of claim 10, wherein the predetermined pressure range is set at 0.1 to 0.3 Torr when the internal pressure of the processing chamber is 1 to 3 Torr, the predetermined pressure range is set at 0.05 to 0.1 Torr when the internal pressure of the processing chamber is 3 to 5 Torr, and the predetermined pressure range is set at 0.01 to 0.05 Torr when the internal pressure of the processing chamber is 5 to 10 Torr.

12. The method of claim 4, wherein the rotary table is configured to move up and down, the substrate is mounted on the rotary table in a state in which the rotary table is moved down, and the substrate process is performed in a state in which the rotary table is moved up.

13. The method of claim 1, wherein an internal temperature of the processing chamber is set at 400 degrees C. or higher.

14. A substrate processing method using a processing chamber that is provide with: a rotary table configured to mount a substrate on an upper surface thereof; and a processing chamber including a first raw material gas supply region defined above the rotary table in a mutually spaced-apart relationship along a rotational direction of the rotary table and through which a raw material gas is supplied to the substrate, a first reaction gas supply region to which a reaction gas capable of reacting with the raw material gas to generate a reaction product is supplied, a second raw material gas supply region to which the raw material gas is supplied, a second reaction gas supply region to which the reaction gas is supplied, a first exhaust port formed in a bottom portion of the first raw material gas supply region and through which the raw material gas supplied to the first raw material gas supply region is exhausted, a second exhaust port formed in a bottom portion of the first reaction gas supply region and through which the reaction gas supplied to the first reaction gas supply region is exhausted, a third exhaust port formed in a bottom portion of the second raw material gas supply region and through which the raw material gas supplied to the second raw material gas supply region is exhausted, a fourth exhaust port formed in a bottom portion of the second reaction gas supply region and through which the reaction gas supplied to the second reaction gas supply region is exhausted, and a communication space formed below the rotary table and common to the first raw material gas, the first reaction gas, a second raw material gas, and the second reaction gas and through which the first to fourth exhaust ports communicate with one another, wherein an exhaust pressure in the first exhaust port is set higher than exhaust pressures in the second to fourth exhaust ports by a predetermined pressure so that all of the first raw material gas, the first reaction gas, a second raw material gas, and the second reaction gas flow into the communication space while exhausting the first raw material gas through the first exhaust port, the first reaction gas through the second exhaust port, the second raw material gas through the third exhaust port, and the second reaction gas through the fourth exhaust port thereby preventing infiltration of the reaction gas into the first exhaust port.

15. The method of claim 14, wherein the communication space is a space defined under the rotary table, the first raw material gas supply region, the first reaction gas supply region, the second raw material gas supply region and the second reaction gas supply region are separated from each other above the rotary table by separation regions protruding downward from a ceiling surface of the processing chamber and are configured so that infiltration of the reaction gas into the first and second raw material gas supply regions and infiltration of the raw material gas into the first and second reaction gas supply regions are not generated, and the substrate process is performed by rotating the rotary table while carrying out the exhaust of the raw material gas and the reaction gas from the first to fourth exhaust ports, the supply of the raw material gas to the first and second raw material gas supply regions and the supply of the reaction gas to the first and second reaction gas supply regions.

16. The method of claim 14, wherein the predetermined pressure falls within a predetermined pressure range.

17. The method of claim 16, wherein the predetermined pressure range is set at 0.015 to 0.06 Torr when an internal pressure of the processing chamber is 1 to 3 Torr, the predetermined pressure range is set at 0.01 to 0.03 Torr when the internal pressure of the processing chamber is 3 to 5 Torr, and the predetermined pressure range is set at 0.005 to 0.015 Torr when the internal pressure of the processing chamber is 5 to 10 Torr.

18. The method of claim 15, wherein a purge gas is supplied from the separation region, the purge gas in addition to the raw material gas is exhausted from the first and third exhaust ports, and the purge gas in addition to the reaction gas is exhausted from the second and fourth exhaust ports.

* * * * *